(12) United States Patent
Okada et al.

(10) Patent No.: US 11,862,696 B2
(45) Date of Patent: Jan. 2, 2024

(54) SEMICONDUCTOR STORAGE DEVICE

(71) Applicant: Kioxia Corporation, Tokyo (JP)

(72) Inventors: Shunsuke Okada, Suzuka (JP);
Tomonori Aoyama, Yokkaichi (JP);
Tatsunori Isogai, Yokkaichi (JP);
Masaki Noguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 37 days.

(21) Appl. No.: 17/120,951

(22) Filed: Dec. 14, 2020

(65) Prior Publication Data

US 2021/0296458 A1 Sep. 23, 2021

(30) Foreign Application Priority Data

Mar. 18, 2020 (JP) ................................. 2020-047862

(51) Int. Cl.
*H01L 29/423* (2006.01)
*H01L 21/28* (2006.01)
*H01L 29/51* (2006.01)
*H10B 43/27* (2023.01)

(52) U.S. Cl.
CPC .... *H01L 29/4234* (2013.01); *H01L 29/40117* (2019.08); *H01L 29/513* (2013.01); *H01L 29/517* (2013.01); *H10B 43/27* (2023.02)

(58) Field of Classification Search
CPC .............. H01L 29/4234; H01L 29/513; H01L 27/11582; H01L 29/517
See application file for complete search history.

(56) References Cited

U.S. PATENT DOCUMENTS

| | | | |
|---|---|---|---|
| 9,166,032 B1* | 10/2015 | Higuchi | ............ H01L 27/11582 |
| 10,553,608 B2 | 2/2020 | Aoyama | |
| 10,651,195 B2 | 5/2020 | Lee et al. | |
| 10,658,480 B2 | 5/2020 | Ohba | |
| 2012/0001252 A1* | 1/2012 | Alsmeier | .......... H01L 27/11578 |
| | | | 257/E21.679 |
| 2019/0139983 A1 | 5/2019 | Lee et al. | |
| 2019/0267393 A1 | 8/2019 | Aoyama | |
| 2020/0388686 A1* | 12/2020 | Eom | ................. H01L 21/02244 |

FOREIGN PATENT DOCUMENTS

| | | |
|---|---|---|
| JP | 2019-087748 A | 6/2019 |
| JP | 2019-149445 A | 9/2019 |
| JP | 2019-169554 A | 10/2019 |

* cited by examiner

*Primary Examiner* — Mohammad M Choudhry
(74) *Attorney, Agent, or Firm* — Oblon, McClelland, Maier & Neustadt, L.L.P.

(57) ABSTRACT

A semiconductor storage device relating to one embodiment includes: a stacked body in which electrode films and insulating films are alternately stacked in a first direction; a first and a second charge storage films that are arranged away from each other in the first direction inside the stacked body and each face one of the electrode films; and a tunnel insulating film that extends in the first direction inside the stacked body and is in contact with the first and the second charge storage films. The first and the second charge storage films each include a first film that is in contact with the electrode film and contains a High-k material, and a second film that is provided between the first film and the tunnel insulating film and contains silicon nitride.

7 Claims, 24 Drawing Sheets

US 11,862,696 B2

SEMICONDUCTOR STORAGE DEVICE

CROSS-REFERENCE TO RELATED APPLICATIONS

This application is based upon and claims the benefit of priority from Japanese Patent Application No. 2020-047862, filed on Mar. 18, 2020; the entire contents of which are incorporated herein by reference.

FIELD

Embodiments of the present invention relate to a semiconductor storage device.

BACKGROUND

An example of a semiconductor storage device is a three-dimensional semiconductor memory. In the three-dimensional semiconductor memory, generally, a memory film is formed inside a laminated body in which a plurality of electrode films and interlayer insulating films are laminated. In the memory film, generally, a block insulating film, a charge storage film and a tunnel insulating film are laminated.

In the three-dimensional semiconductor memory as described above, when a film thickness of the electrode film and the interlayer insulating film is reduced as a lamination number increases, electric charges retained in the charge storage film easily move.

DETAILED DESCRIPTION

Embodiments will now be explained with reference to the accompanying drawings. The present invention is not limited to the embodiments.

A semiconductor storage device relating to one embodiment includes: a stacked body in which electrode films and insulating films are alternately stacked in a first direction; a first and a second charge storage films that are arranged away from each other in the first direction inside the stacked body and each face one of the electrode films; and a tunnel insulating film that extends in the first direction inside the stacked body and is in contact with the first and the second charge storage films. The first and the second charge storage films each include a first film that is in contact with the electrode film and contains a High-k material, and a second film that is provided between the first film and the tunnel insulating film and contains silicon nitride.

First Embodiment

Figure 1:
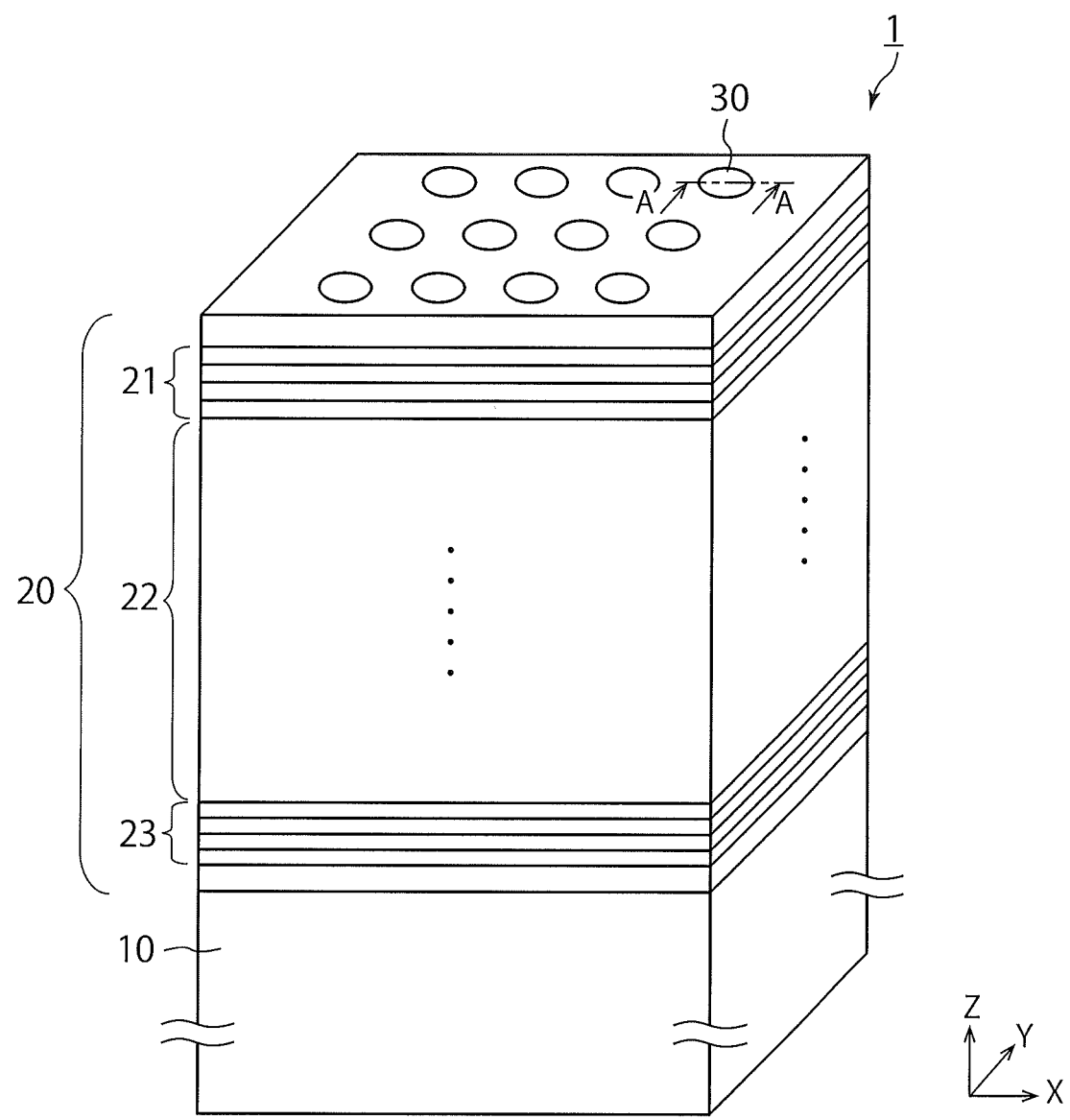
FIG. 1 is a perspective view illustrating a structure of a main part of a semiconductor storage device relating to a first embodiment.

FIG. 1 is a perspective view illustrating a structure of a main part of the semiconductor storage device relating to the first embodiment. A semiconductor storage device 1 illustrated in FIG. 1 includes a substrate 10, a laminated (stacked) body 20, and a plurality of semiconductor films 30. In the following description, two directions that are the direction parallel to the substrate 10 and are orthogonal to each other are defined as an X direction and a Y direction. In addition, the direction that is vertical to the substrate 10 and are orthogonal to the X direction and the Y direction is defined as a Z direction. The Z direction is also the first direction of the laminated body 20.

The substrate 10 is a silicon substrate for example. On the substrate 10, the laminated body 20 is provided. Note that, between the substrate 10 and the laminated body 20, a layer including a drive element such as a transistor used to drive the semiconductor films 30 or a layer where wiring used to drive the semiconductor films 30 is formed may be formed.

The laminated body 20 includes an SGD 21, a cell 22 and an SGS 23. The SGD 21 is positioned in a top layer of the laminated body 20, and includes a plurality of drain side selection gate electrodes. The SGS 23 is positioned in a bottom layer of the laminated body 20, and includes a plurality of source side selection gate electrodes. The cell 22 is positioned between the SGD 21 and the SGS 23, and includes a plurality of word lines.

The plurality of semiconductor films 30 are arranged zigzag in the X direction and the Y direction. In addition, each semiconductor film 30 extends in the Z direction inside the laminated body 20.

Figure 2:
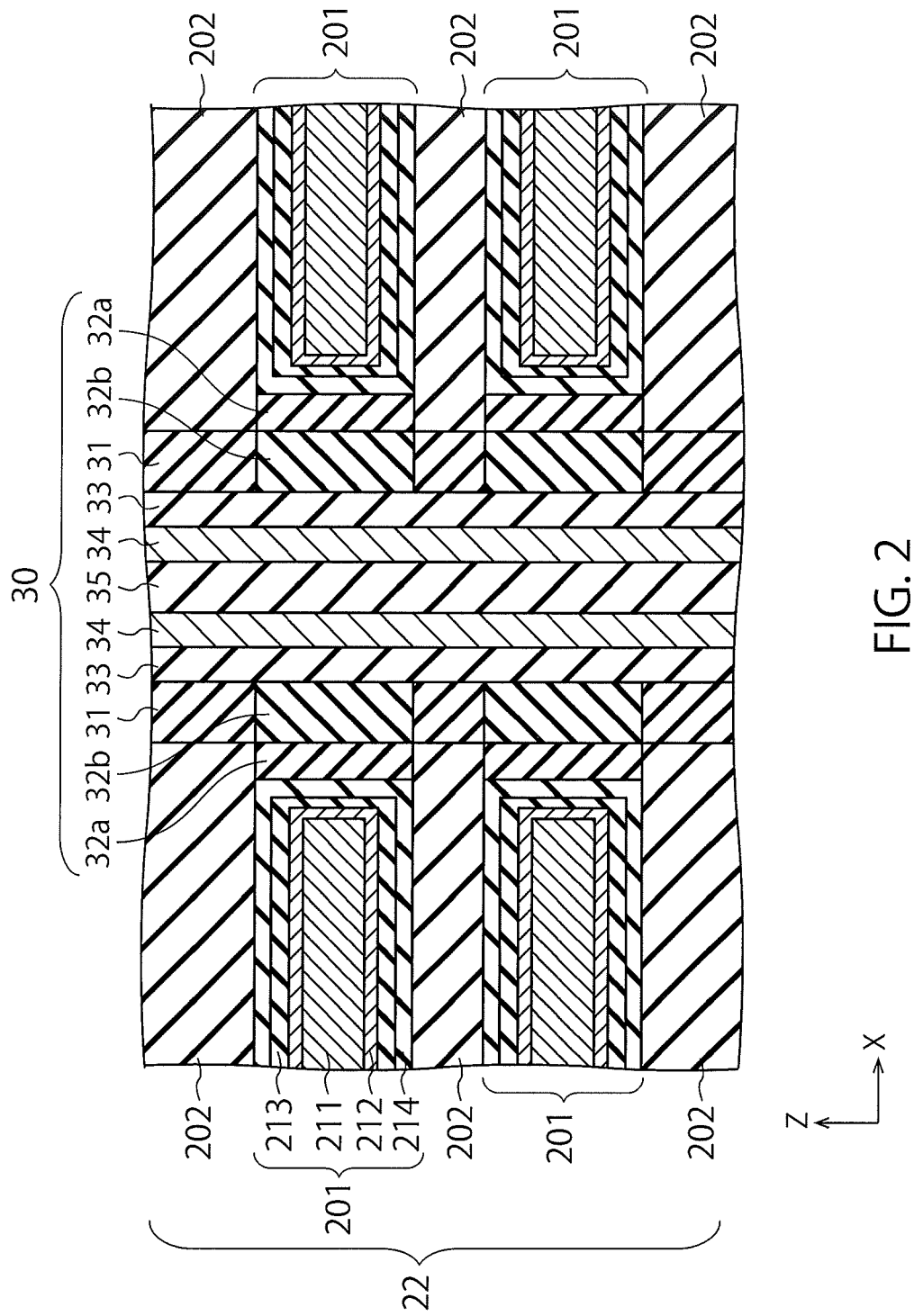
FIG. 2 is a drawing illustrating part of a cross section along a cutting line A-A illustrated in FIG. 1.

FIG. 2 is a drawing illustrating part of a cross section along a cutting line A-A illustrated in FIG. 1. Here, structures of the cell 22 and the semiconductor film 30 will be described with reference to FIG. 2.

First, the structure of the cell 22 will be described. As illustrated in FIG. 2, in the cell 22, a plurality of electrode films 201 in a planar shape and a plurality of interlayer insulating films 202 are alternately laminated in the Z direction.

The electrode film 201 includes a metal film 211, a barrier metal film 212, a block insulating film 213, and a block insulating film 214. The metal film 211 contains a metal such as tungsten (W), and functions as the word line. The barrier metal film 212 contains titanium nitride (TiN) for example, and covers the metal film 211 in order to prevent diffusion of the metal contained in the metal film 211. The block insulating film 213 contains aluminum oxide ($Al_2O_3$) for example, and covers the barrier metal film 212. The block insulating film 214 contains silicon oxide ($SiO_2$) for example, and covers the block insulating film 213.

On the other hand, the interlayer insulating film 202 contains the silicon oxide. By the interlayer insulating films 202, the plurality of electrode films 201 are electrically insulated from each other.

Note that the SGD 21 is provided with the drain side selection gate electrodes having the structure similar to the electrode film 201. In addition, the SGS 23 is also provided with the source side selection gate electrodes having the structure similar to the electrode film 201.

Next, the structure of the semiconductor film 30 will be described. The semiconductor film 30 illustrated in FIG. 2 includes a block insulating film 31, charge storage films 32a, charge storage films 32b, a tunnel insulating film 33, a channel film 34, and a core film 35. The block insulating film 31, the charge storage films 32a, the charge storage films 32b and the tunnel insulating film 33 are examples of a memory film.

The block insulating film 31 is a cylindrical film containing the silicon oxide for example, and is alternately laminated with the charge storage films 32b in the Z direction in the cell 22. By the laminated structure, the block insulating film 31 is interposed between the charge storage films 32b. Therefore, the individual charge storage films 32b are arranged apart holding the block insulating film 31 therebetween.

Each charge storage film 32a is an example of the cylindrical first film containing the High-k material. The charge storage films 32a are arranged apart in the Z direction holding the interlayer insulating films 202 therebetween and face the electrode films 201.

The charge storage film 32b is an example of the cylindrical second film containing the silicon nitride (SiN). The charge storage film 32b is provided between the charge storage film 32a and the tunnel insulating film 33. In addition, a width (length) in the Z direction of the charge storage film 32a and the charge storage film 32b is greater than a width (length) in the Z direction of the metal film 211.

The tunnel insulating film 33 is a cylindrical film in contact with the block insulating film 31 and the charge storage films 32b. The tunnel insulating film 33 contains silicon oxide for example. The channel film 34 is a cylindrical film provided between the tunnel insulating film 33 and the core film 35. The channel film 34 contains polysilicon. The core film 35 is a columnar film containing the silicon oxide for example.

In the semiconductor storage device 1 relating to the present embodiment, an intersection of the semiconductor film 30 and each electrode film 201 is a vertical transistor. Of the vertical transistor, an intersection of the metal film 211 (word line) of the cell 22 and the semiconductor film 30 is a memory cell. Note that an intersection of the drain side selection gate electrode of the SGD 21 and the semiconductor film 30 is a drain side selection transistor. In addition, an intersection of the source side selection gate electrode of the SGS 23 and the semiconductor film 30 is a source side selection transistor. The drain side selection transistor, the memory cell and the source side selection transistor are connected in series.

Hereinafter, with reference to FIGS. 3-9, a manufacturing process of the semiconductor storage device relating to the present embodiment will be described. Here, the manufacturing process of the cell 22 will be described in detail.

Figure 3:
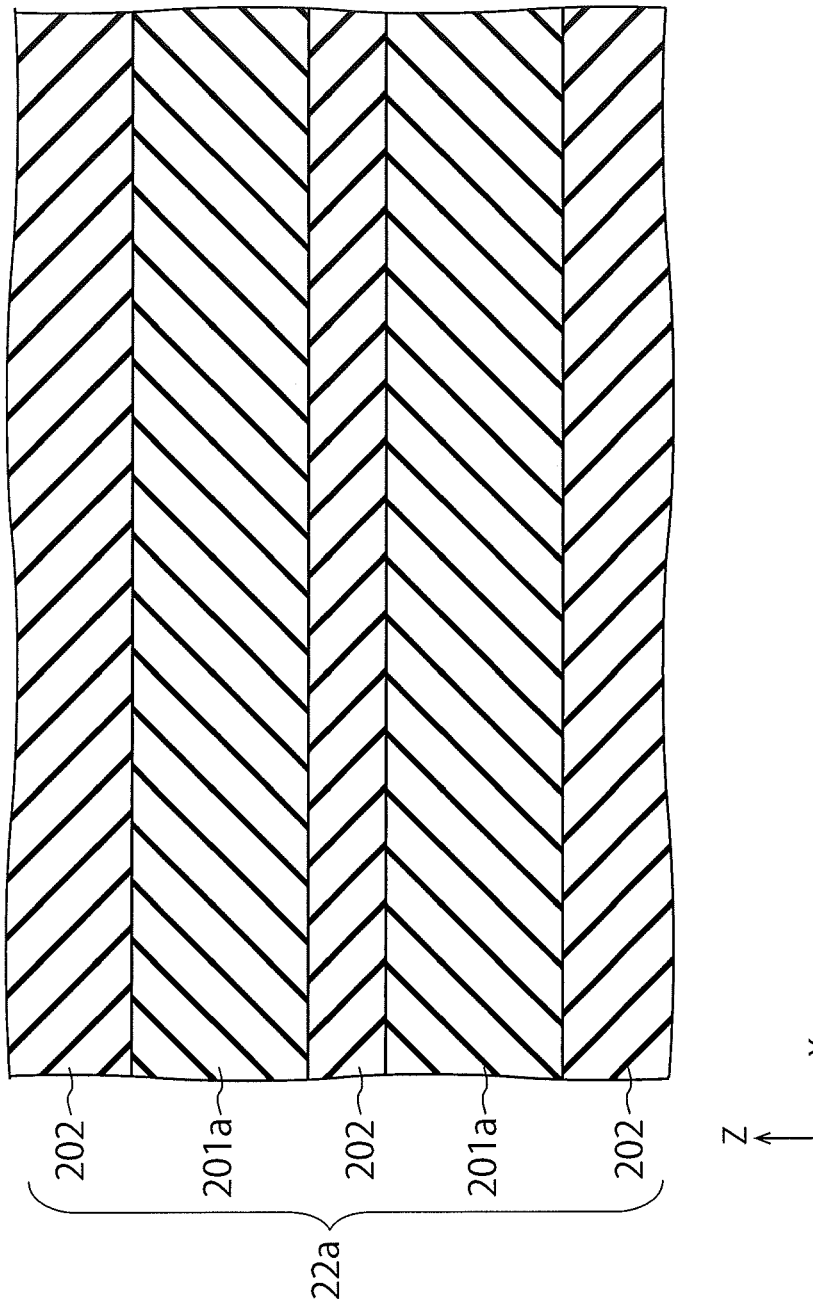
FIG. 3 is a cross sectional view illustrating a process of forming a laminated body.

First, as illustrated in FIG. 3, a laminated body 22a is formed on the substrate 10 (not illustrated in FIG. 3). In the laminated body 22a, a plurality of sacrifice films 201a in the planar shape and the plurality of interlayer insulating films 202 are alternately laminated in the Z direction. The sacrifice films 201a contain the silicon nitride for example. The laminated body 22a can be formed by CVD (Chemical Vapor Deposition) or ALD (Atomic Layer Deposition) for example.

Figure 4:
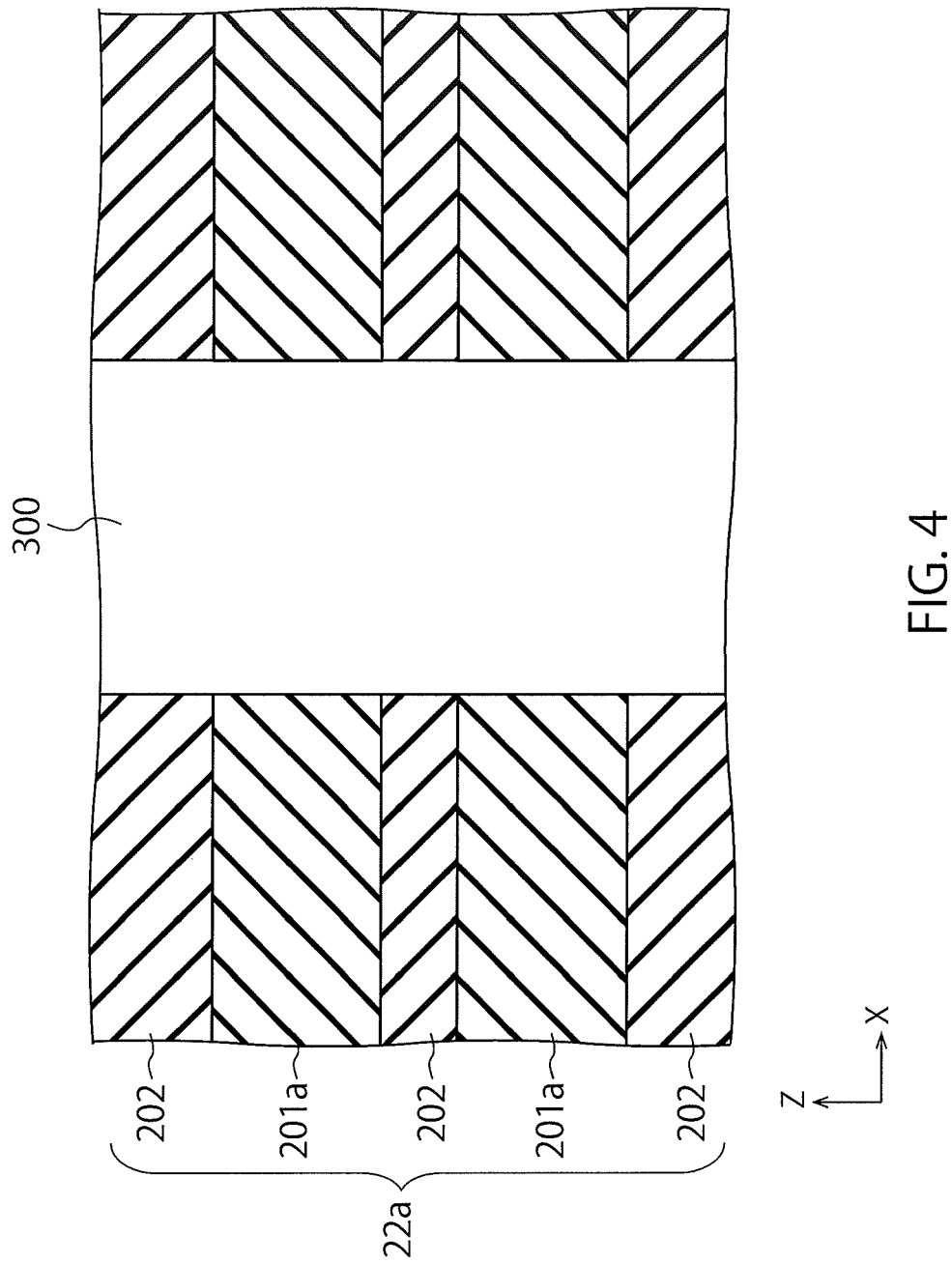
FIG. 4 is a cross sectional view illustrating a process of forming a hole in the laminated body.

Next, as illustrated in FIG. 4, a hole 300 penetrating the laminated body 22a in the Z direction is formed. The hole 300 is formed at an arrangement location of the semiconductor film 30 described above. The hole 300 can be formed by RIE (Reactive Ion Etching) for example.

Figure 5:
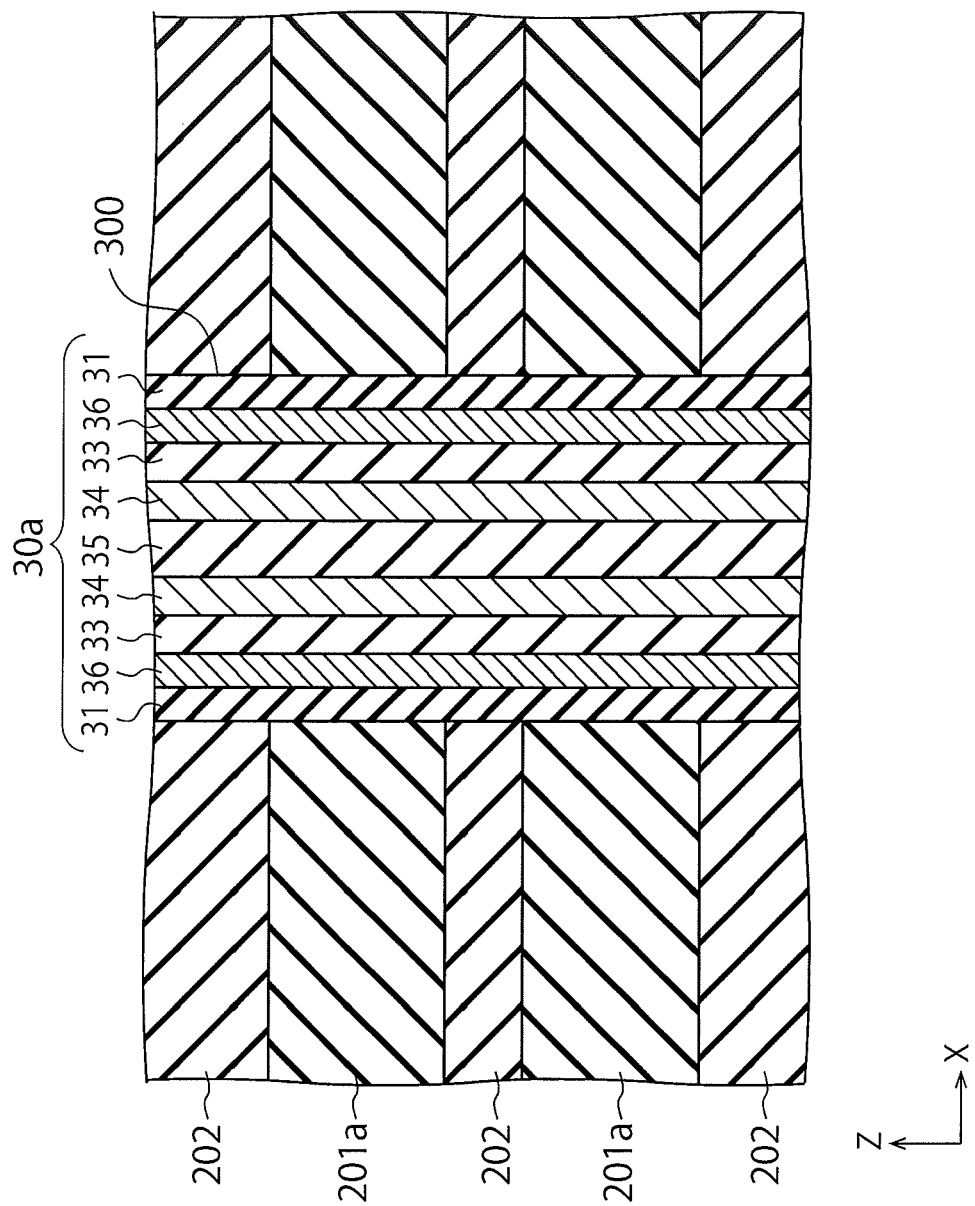
FIG. 5 is a cross sectional view illustrating a process of forming a semiconductor film inside the hole.

Then, as illustrated in FIG. 5, a semiconductor film 30a is formed inside the hole 300. Specifically, the block insulating film 31, a dummy film 36, the tunnel insulating film 33, the channel film 34 and the core film 35 are consecutively formed in the order. The dummy film 36 contains the polysilicon, for example.

For the dummy film 36 and the channel film 34, for example, an amorphous silicon film is formed under a low temperature condition of about 500° C. and then heat treatment of 800° C. or higher is executed. Thus, silicon contained in the dummy film 36 and the channel film 34 is polycrystallized. Note that the heat treatment of the dummy film 36 may be performed simultaneously with the heat treatment of the channel film 34.

Figure 6:
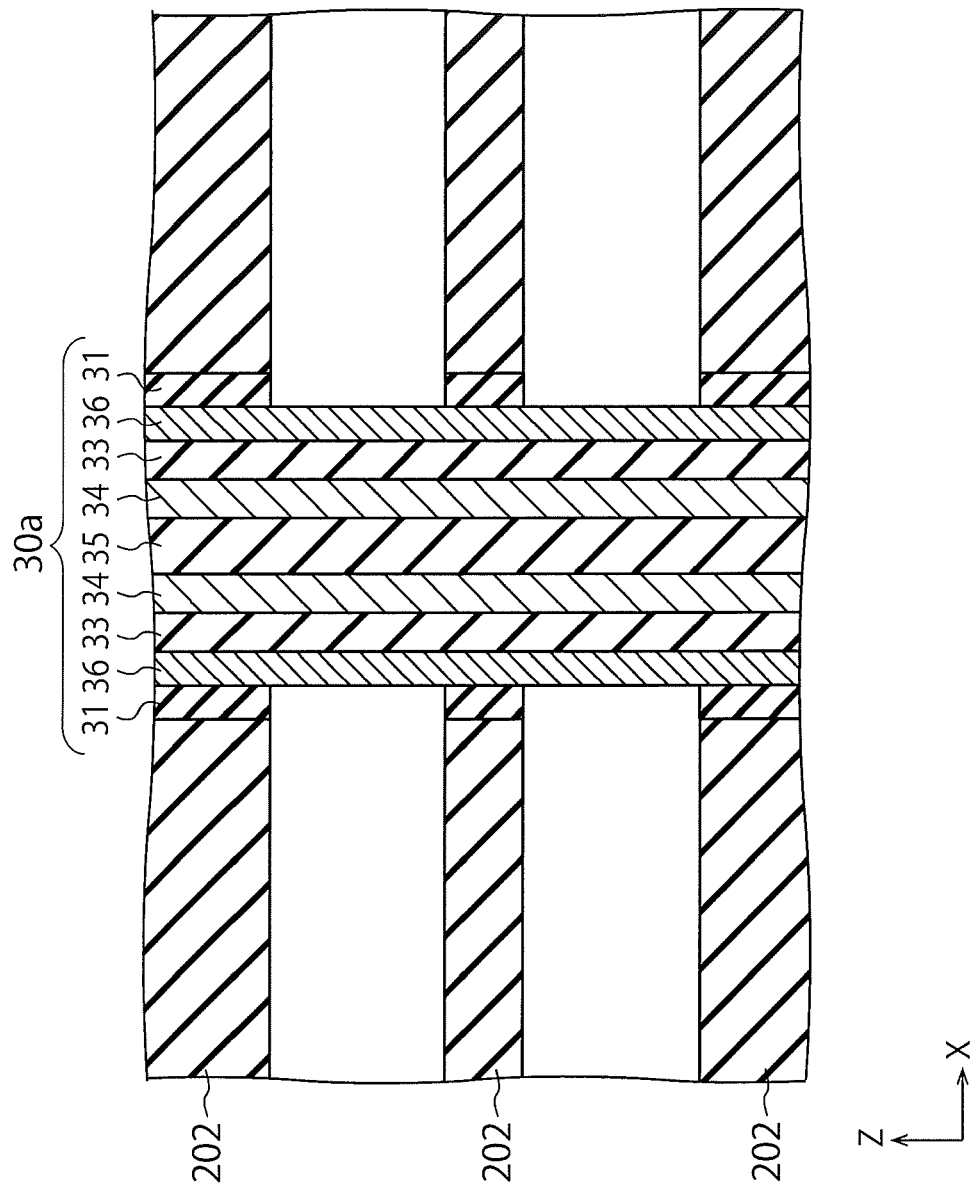
FIG. 6 is a cross sectional view illustrating a process of removing sacrifice films and a block insulating film.

Next, as illustrated in FIG. 6, the sacrifice films 201a are removed, and an exposed part of the block insulating film 31 exposed by removing the sacrifice films 201a is removed. The sacrifice films 201a can be removed by wet etching using a liquid chemical containing phosphoric acid for example. On the other hand, the block insulating film 31 can be removed by wet etching using a liquid chemical containing hydrofluoric acid for example. By removing part of the block insulating film 31 in this way, a part of the dummy film 36 is exposed.

Figure 7:
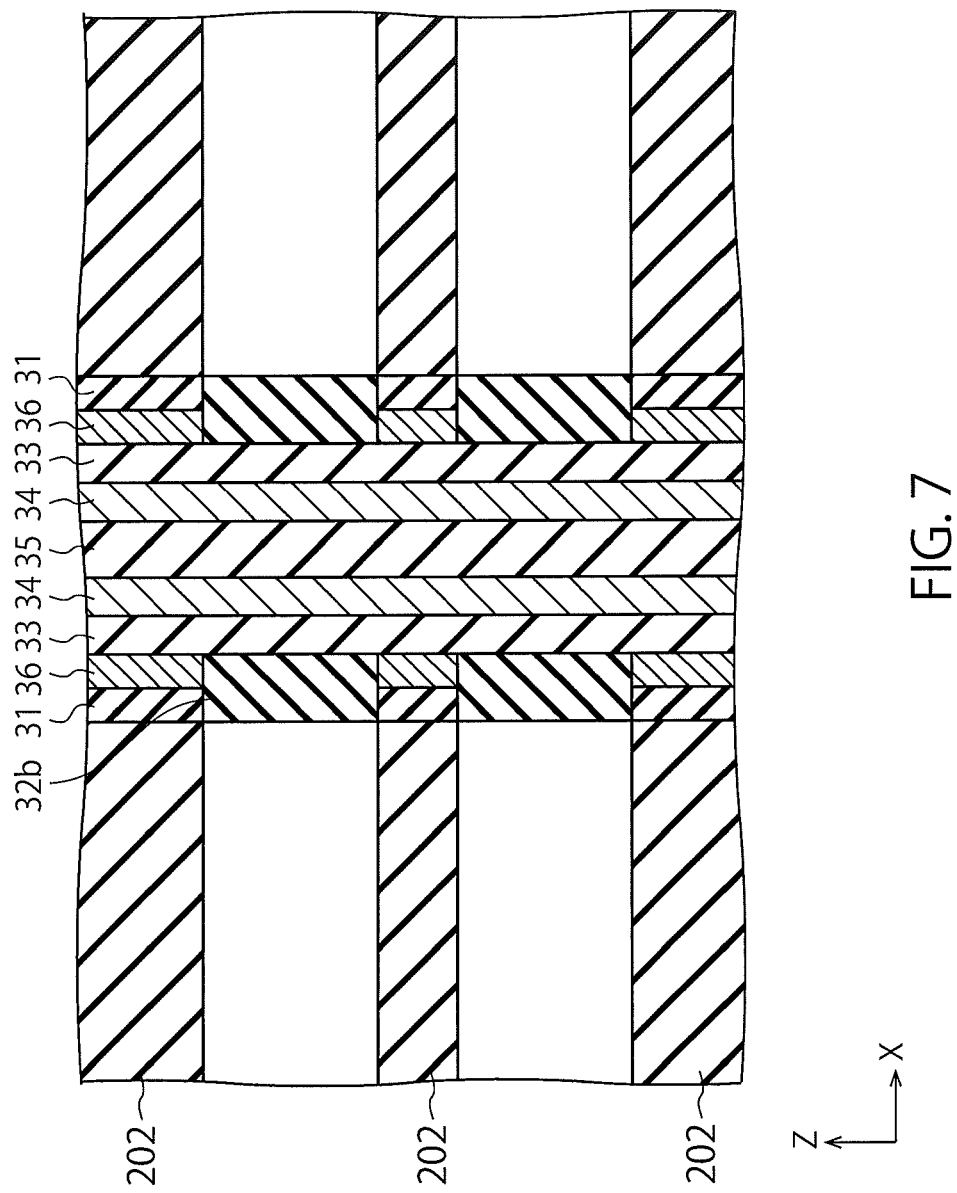
FIG. 7 is a cross sectional view illustrating a process of forming a charge storage film of the first embodiment.

Then, as illustrated in FIG. 7, the charge storage films 32b are formed at the exposed parts of the dummy film 36. Specifically, first of all, the polysilicon contained in the dummy film 36 is subjected to radical nitriding or thermal nitriding. Therefore, the exposed parts of the dummy film 36 are changed into a silicon nitride film. Consequently, the silicon nitride film is increased by a thickness of the block insulating film 31. Thus, the charge storage films 32b are completed. As a method of selectively increasing the silicon nitride film, for example, low pressure vapor phase growth (LPCVD) or the ALD is used, and an incubation time difference or a selective growth method can be utilized.

Figure 8:
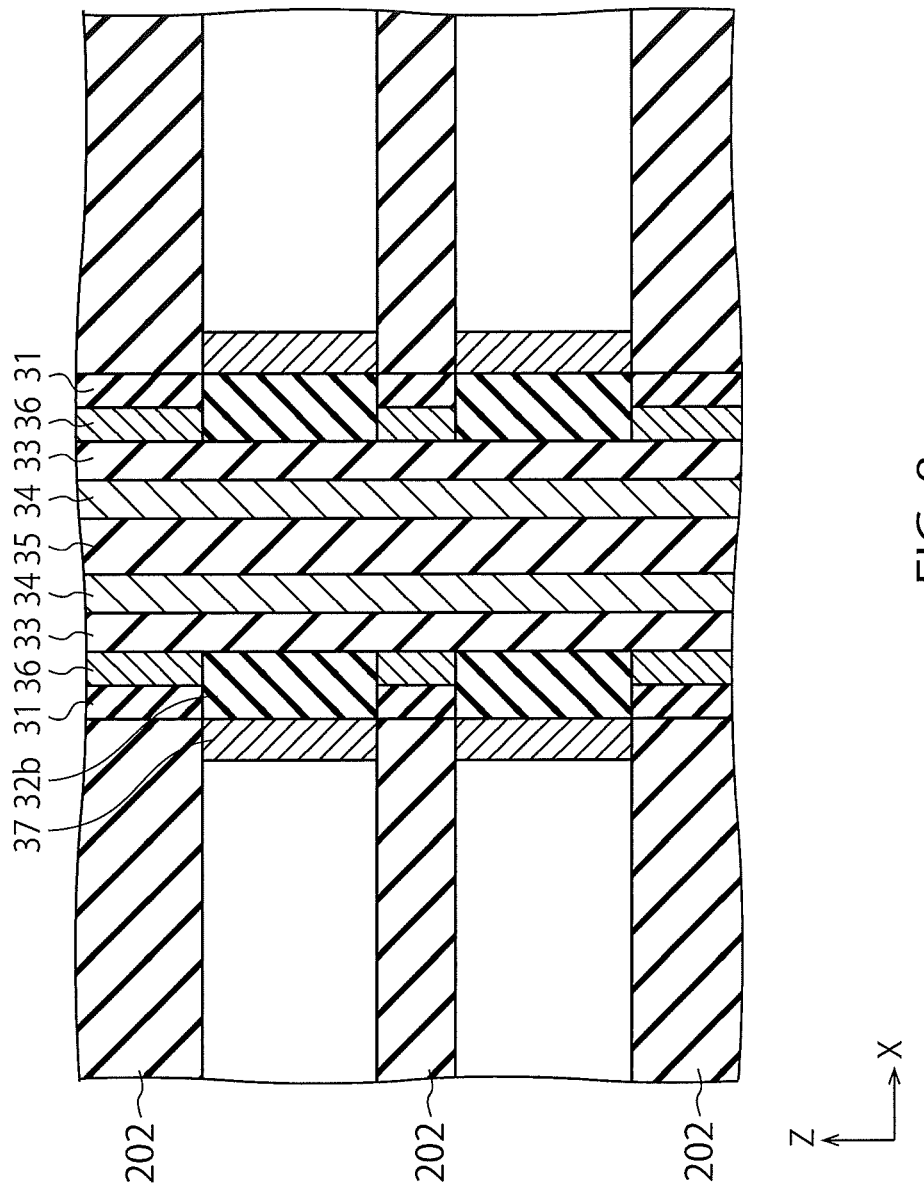
FIG. 8 is a cross sectional view illustrating the process of forming the charge storage film of the first embodiment.

Next, as illustrated in FIG. 8, metal films 37 are selectively formed on the charge storage films 32b using sputtering for example. The metal films 37 contain, for example, metallic elements of hafnium (Hf), aluminum (Al), titanium (Ti), barium (Ba), ruthenium (Ru), lanthanum (La), zirconium (Zr), iodine (Y), magnesium (Mg), tantalum (Ta), strontium (Sr), and niobium (Nb), or a metal compound configured from two or more of the metallic elements.

Figure 9:
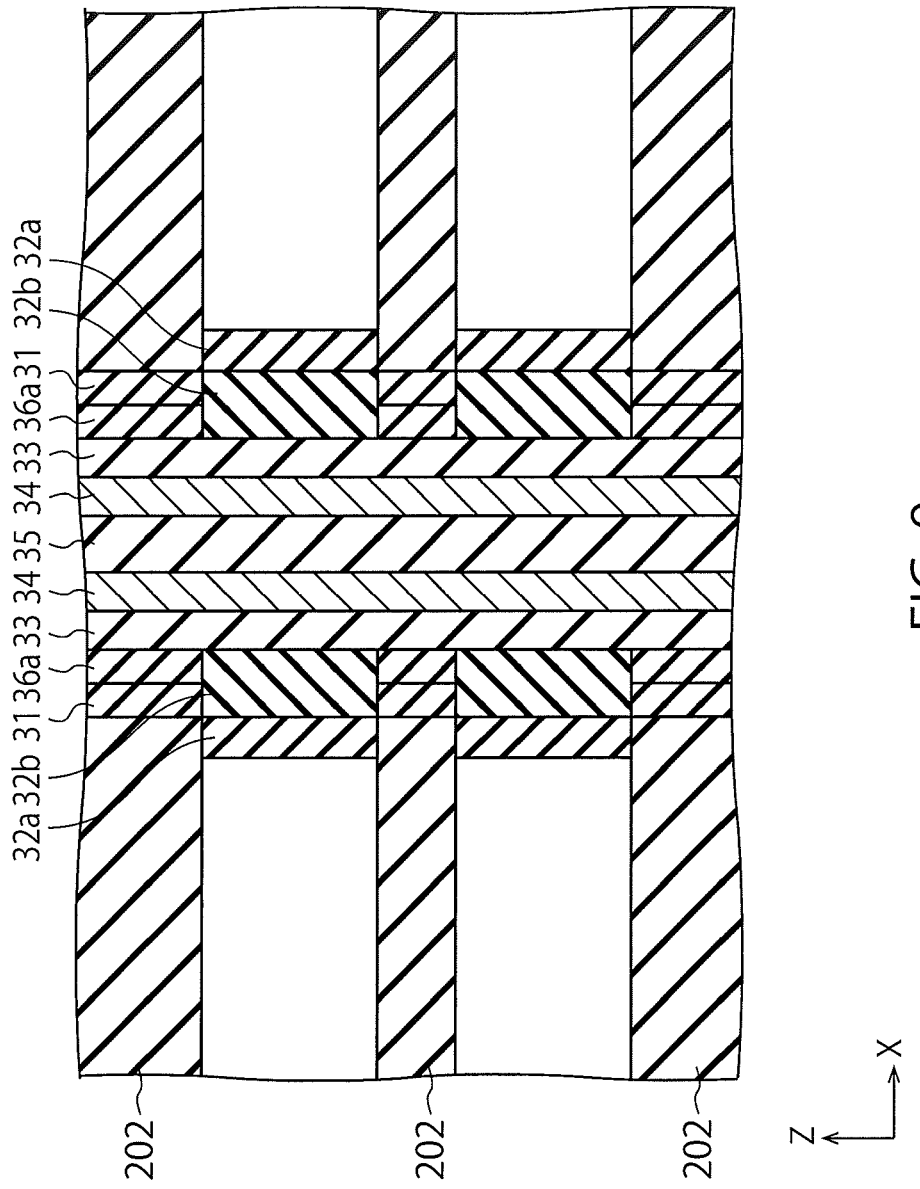
FIG. 9 is a cross sectional view illustrating the next process of forming the charge storage film of the first embodiment.

Then, as illustrated in FIG. 9, by subjecting the metal films 37 to radical oxidation, the charge storage films 32a are formed. At the time, the polysilicon remaining in the dummy film 36 without being nitrided when forming the charge storage films 32b is oxidized and silicon oxide films 36a are also formed. The silicon oxide films 36a are integrated with the block insulating film 31 containing the silicon oxide. By formation of the silicon oxide films 36a, a route through which electric charges move in the Z direction between the charge storage films 32b through the dummy film 36 can be divided.

The charge storage films 32a contain the High-k material in which the metallic element contained in the metal films 37 is oxidized. The High-k material is, for example, hafnium oxide ($HfO_2$), aluminum oxide ($Al_2O_3$), titanium oxide ($TiO_2$), barium oxide (BaO), ruthenium tetroxide ($RuO_4$), lanthanum oxide ($La_2O_3$), zirconium oxide ($ZrO_2$), iodine oxide ($Y_2O_3$), magnesium oxide (MgO), tantalum oxide ($Ta_2O_5$), strontium oxide (SrO) or niobium oxide ($Nb_2O_5$). In order to make the electric charges retained in the charge storage films 32a difficult to move, for the charge storage films 32a, a material of a barrier height lower than that of the material of the charge storage films 32b, that is the silicon nitride, is preferably used. As such a material, specifically, the hafnium oxide, the zirconium oxide, the iodine oxide, the tantalum oxide and strontium titanate ($SrTiO_3$) are relevant.

Note that the High-k material may be oxynitride such as aluminum oxynitride (AlON), hafnium oxynitride (HfON), titanium oxynitride (TiON) or zirconium oxynitride (ZrON). In addition, the High-k material may be a mixture of metal oxides of different valences like the aluminum, the iodine and the lanthanum added to the metal oxide such as the titanium oxide, the hafnium oxide or the zirconium oxide or the titanium, the hafnium and the zirconium added to the metal oxide such as the tantalum oxide or the niobium oxide.

After the charge storage films 32a are formed as described above, at removed parts of the sacrifice films 201a, the block insulating film 214, the block insulating film 213, the barrier metal film 212 and the metal film 211 are formed in the order. The films can be formed by the CVD or the ALD for example. As a result, the cell 22 illustrated in FIG. 2 is completed.

According to the present embodiment described above, the moving route of the electric charges in the Z direction between the charge storage films 32a is divided by the interlayer insulating films 202. In addition, the moving route of the electric charges in the Z direction between the charge storage films 32b is also divided by the block insulating films 31 (and the silicon oxide films 36a). Thus, movement of the electric charges retained in the charge storage films 32a and the charge storage films 32b is limited so that a charge retention characteristic can be improved.

In addition, in the present embodiment, since the High-k material is contained in the charge storage films 32a, a charge trap performance is improved. Thus, a data write characteristic can be also improved.

Further, the width in the Z direction of the charge storage film 32a and the charge storage film 32b is greater than the width in the Z direction of the metal film 211. Thus, compared to a case where the widths in the Z direction of the charge storage films and the metal film are about the same, reduction of a tunnel current can be suppressed and an erasing characteristic can be improved.

(Modification 1)

Figure 10:
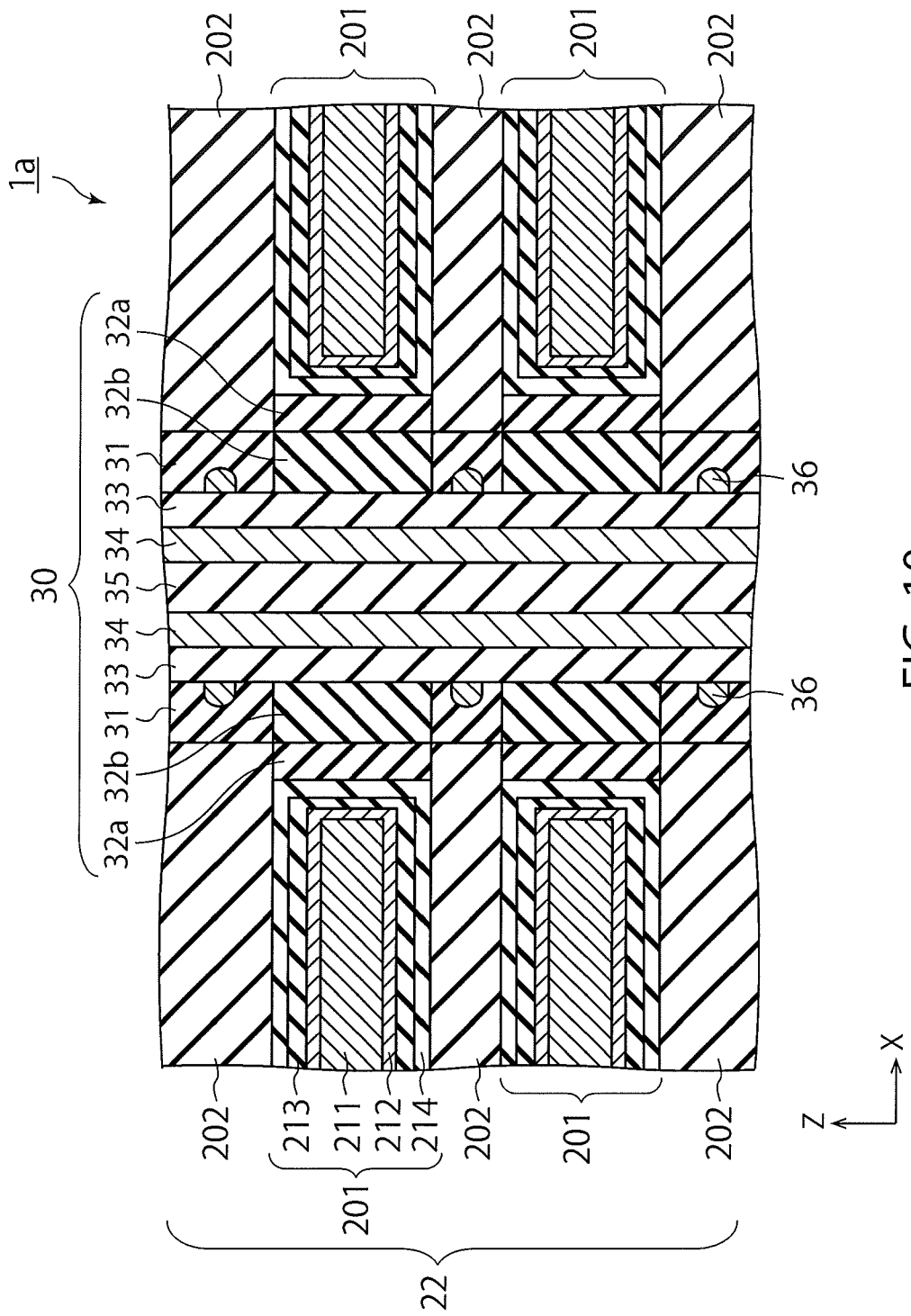
FIG. 10 is a cross sectional view of a cell of a semiconductor storage device relating to a modification of the first embodiment.

FIG. 10 is a cross sectional view of a cell of a semiconductor storage device relating to the modification of the first embodiment. Same signs are attached to components similar to that of the first embodiment described above, and detailed description is omitted.

In a semiconductor storage device 1a illustrated in FIG. 10, part of the dummy film 36 remains inside the block insulating film 31. The part is a polysilicon film remaining without being oxidized when forming the charge storage films 32a (see FIGS. 8 and 9).

In the present modification, the dummy film 36 remaining without being oxidized is covered with the block insulating film 31 as illustrated in FIG. 10, thereby being away from the charge storage films 32b. Therefore, the charge storage films 32b facing each other in the Z direction are not connected through the dummy film 36 so that the movement in the Z direction of the electric charges retained in the charge storage films 32b can be limited.

Thus, the charge retention characteristic can be improved also in the present modification. In addition, in the present modification, since there is no need to completely oxidize the dummy film 36, oxidation time of the dummy film 36 can be shortened.

Second Embodiment

Figure 11:
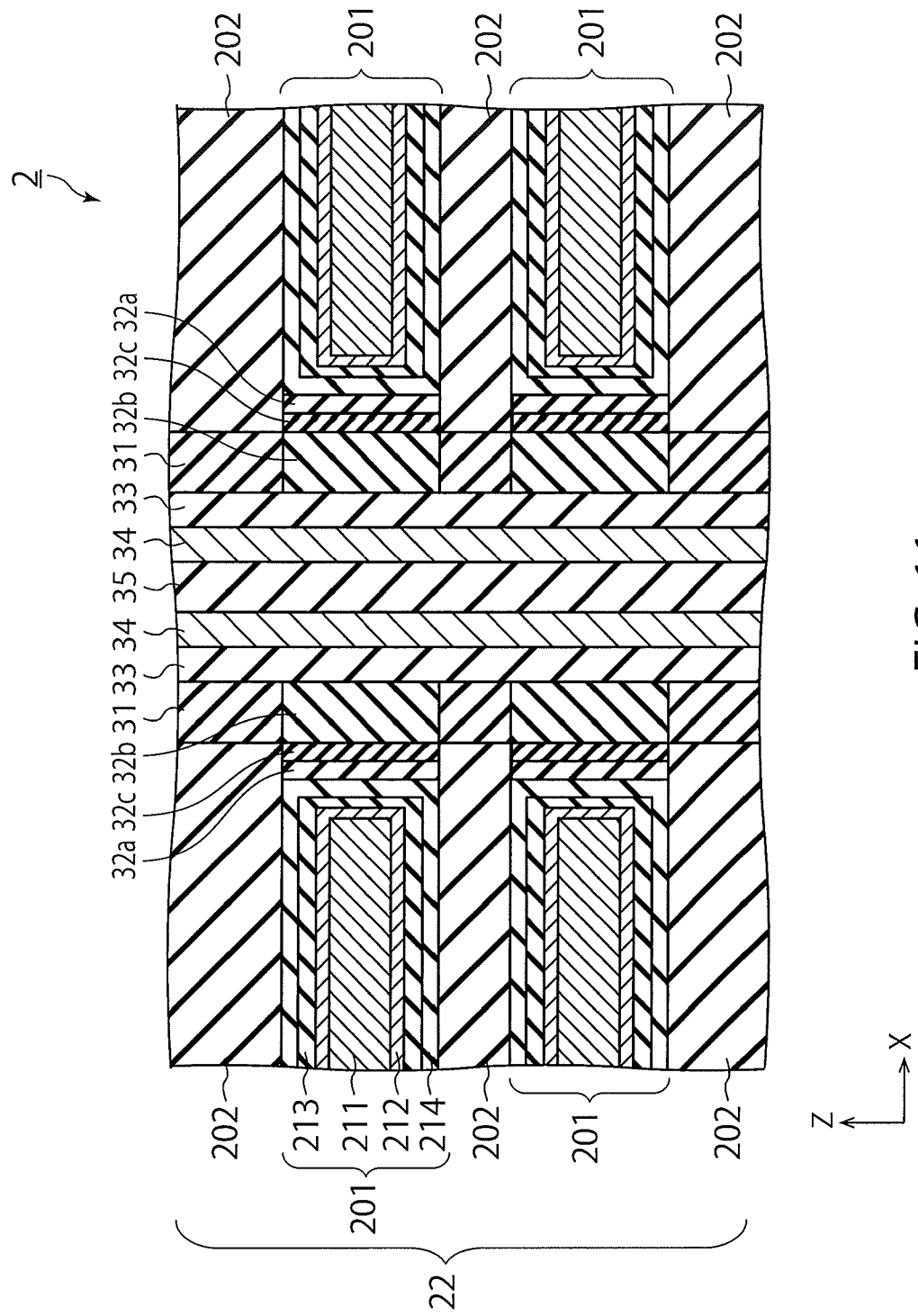
FIG. 11 is a cross sectional view of a cell of a semiconductor storage device relating to a second embodiment.

FIG. 11 is a cross sectional view of a cell of a semiconductor storage device relating to the second embodiment. The same signs are attached to the components similar to that of the first embodiment described above, and the detailed description is omitted.

A semiconductor storage device 2 relating to the present embodiment is different from the first embodiment at a point of further including an oxide film 32c between the charge storage film 32a and the charge storage film 32b. The oxide film 32c contains the silicon oxide. In addition, the width in the Z direction of the charge storage film 32a, the charge storage film 32b and the oxide film 32c is greater than the width in the Z direction of the metal film 211.

Figure 12:
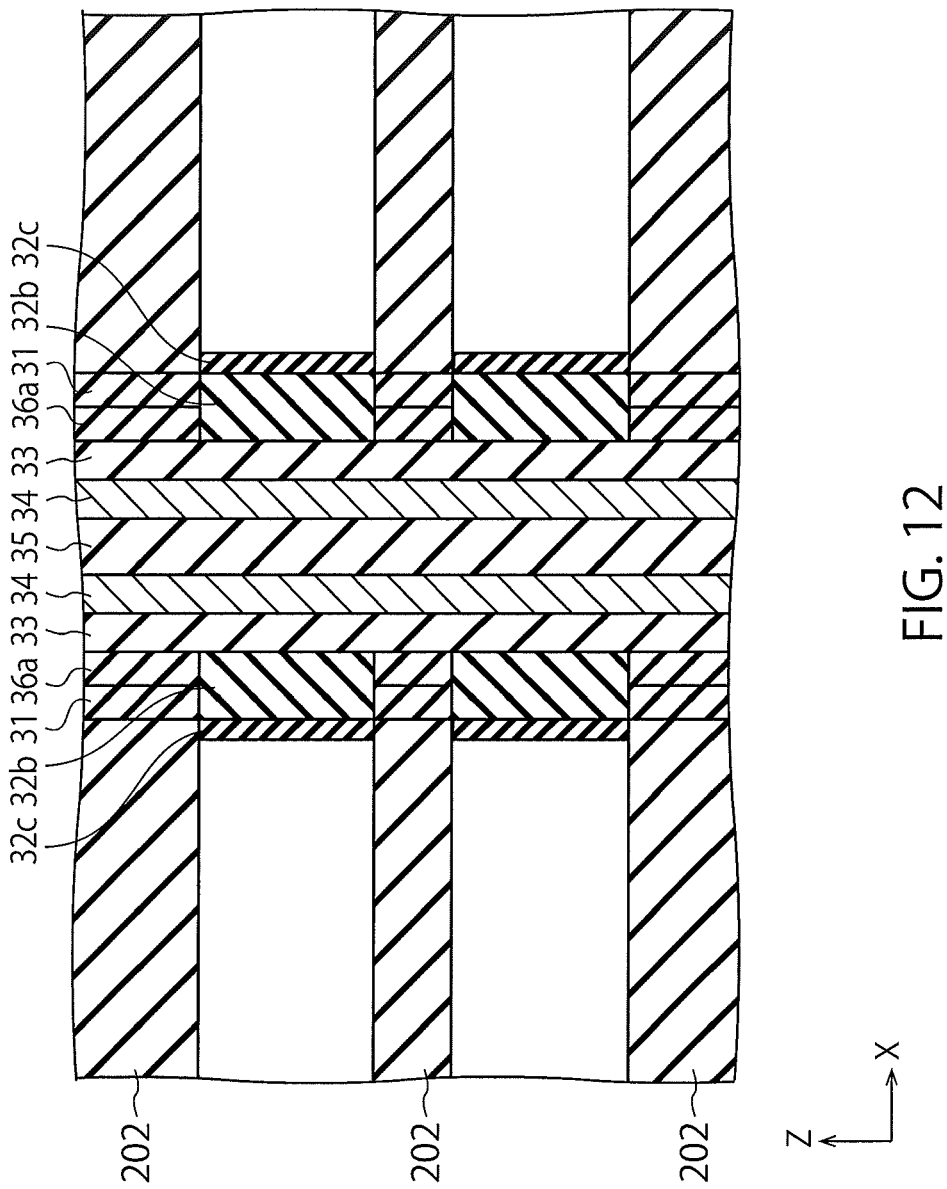
FIG. 12 is a cross sectional view illustrating a process of forming a charge storage film of the second embodiment.

Hereinafter, with reference to FIGS. 12-14, the manufacturing process of the semiconductor storage device 2 relating to the present embodiment will be described. However, since the process from formation of the laminated body 22a to formation of the charge storage films 32b is similar to the first embodiment, the description is omitted.

After forming the charge storage films 32b, a surface of the charge storage films 32b is subjected to the radical oxidation. As a result, as illustrated in FIG. 12, the oxide films 32c are formed on the charge storage films 32b. At the time, the polysilicon remaining in the dummy film 36 without being nitrided when forming the charge storage films 32b is also oxidized and silicon oxide films 36a are formed.

Figure 13:
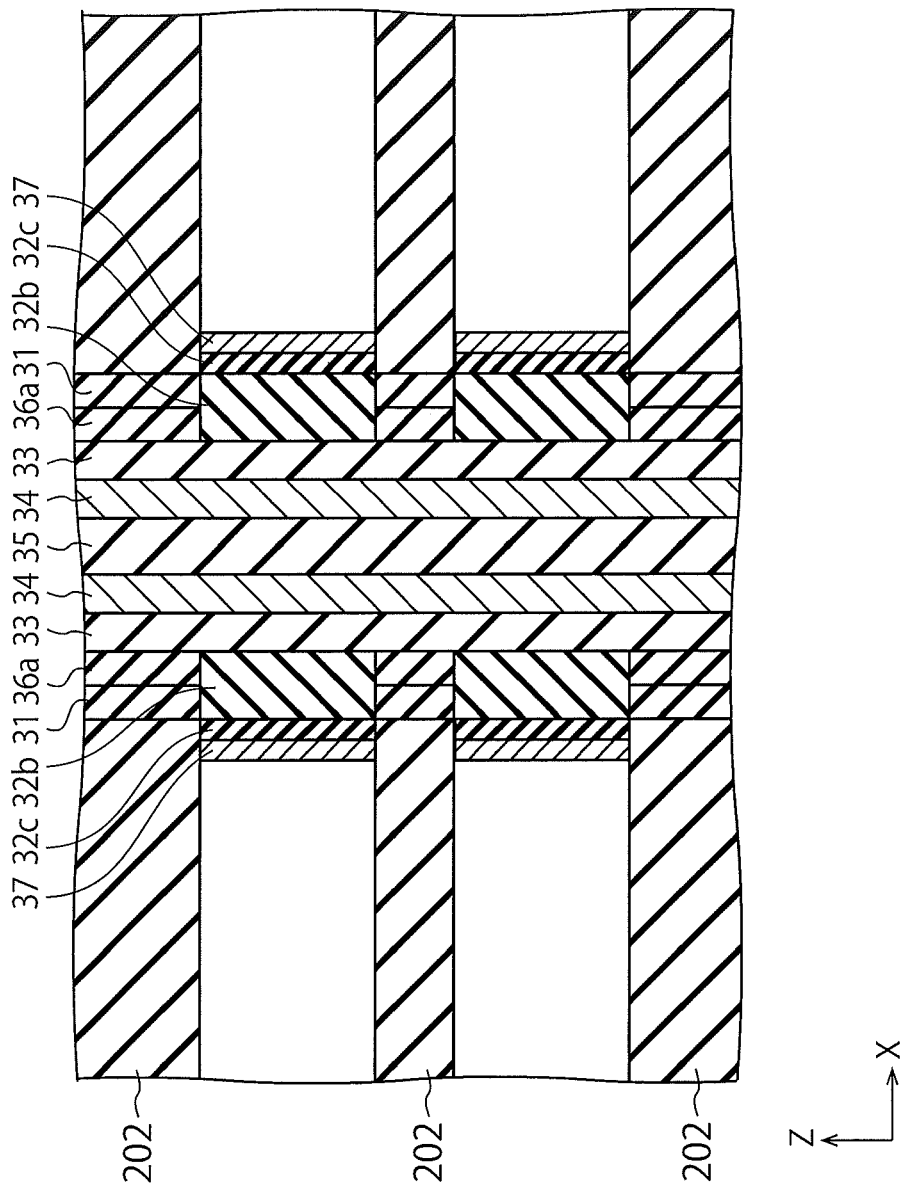
FIG. 13 is a cross sectional view illustrating the process of forming the charge storage film of the second embodiment.

Next, as illustrated in FIG. 13, the metal films 37 are selectively formed on the oxide films 32c. Since a forming method of the metal films 37 and the material of the metal films 37 are similar to the first embodiment, the description is omitted.

Figure 14:
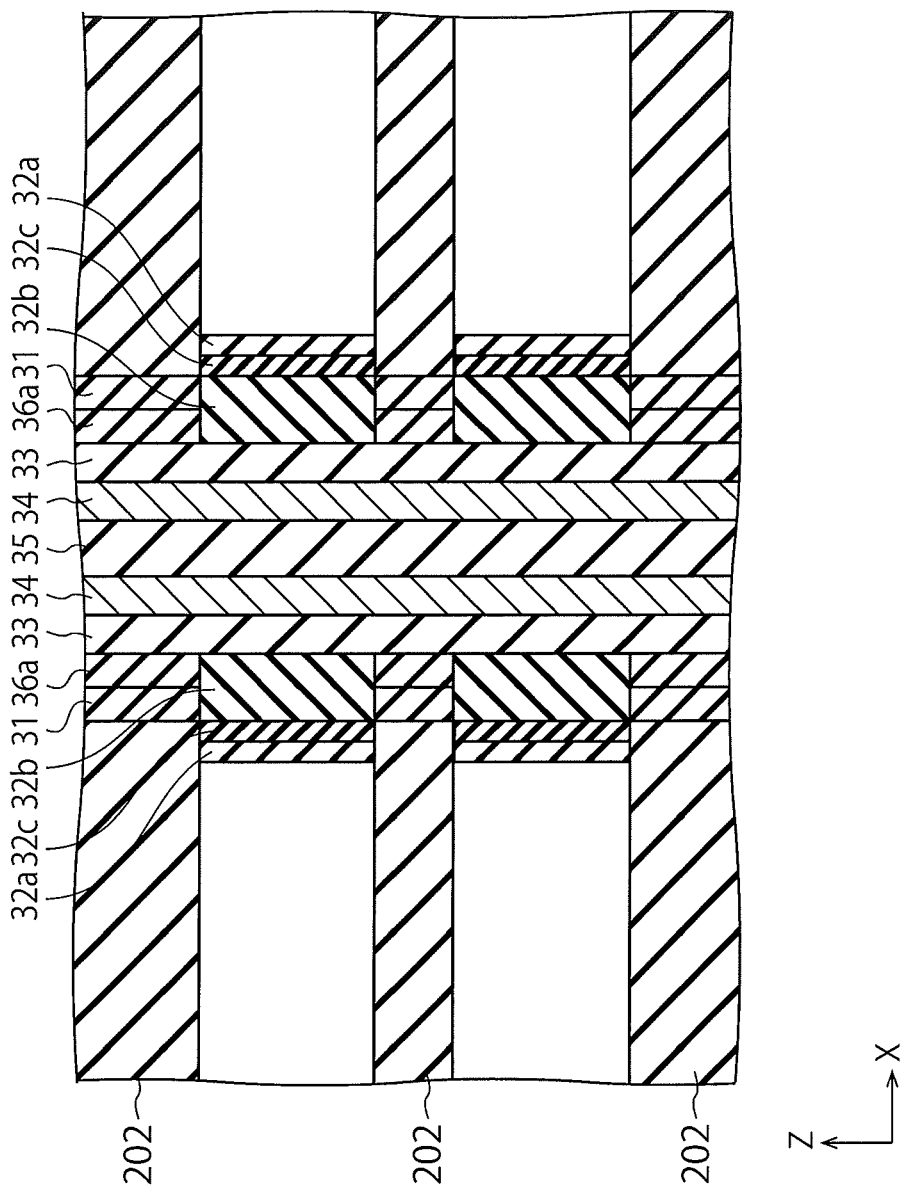
FIG. 14 is a cross sectional view illustrating the process of forming the charge storage film of the second embodiment.

Then, as illustrated in FIG. 14, by subjecting the metal films 37 to the radical oxidation, the charge storage films 32a are formed. Since the material of the charge storage films 32a is similar to the first embodiment, the description is omitted. Note that, the dummy film 36 is oxidized simultaneously with the formation of the oxide films 32c in the present embodiment, but may be oxidized simultaneously with the formation of the charge storage films 32a (the radical oxidation of the metal films 37).

Thereafter, similarly to the first embodiment, at the removed parts of the sacrifice films 201a, the block insulating film 214, the block insulating film 213, the barrier metal film 212 and the metal film 211 are formed in the order. As a result, the cell 22 illustrated in FIG. 11 is completed.

According to the present embodiment described above, the oxide film 32c is provided between the charge storage film 32a and the charge storage film 32b. Therefore, the movement to the side of the charge storage film 32b of the electric charges retained in the charge storage film 32a can be limited by the oxide film 32c. Thus, the charge retention characteristic can be further improved.

Third Embodiment

Figure 15:
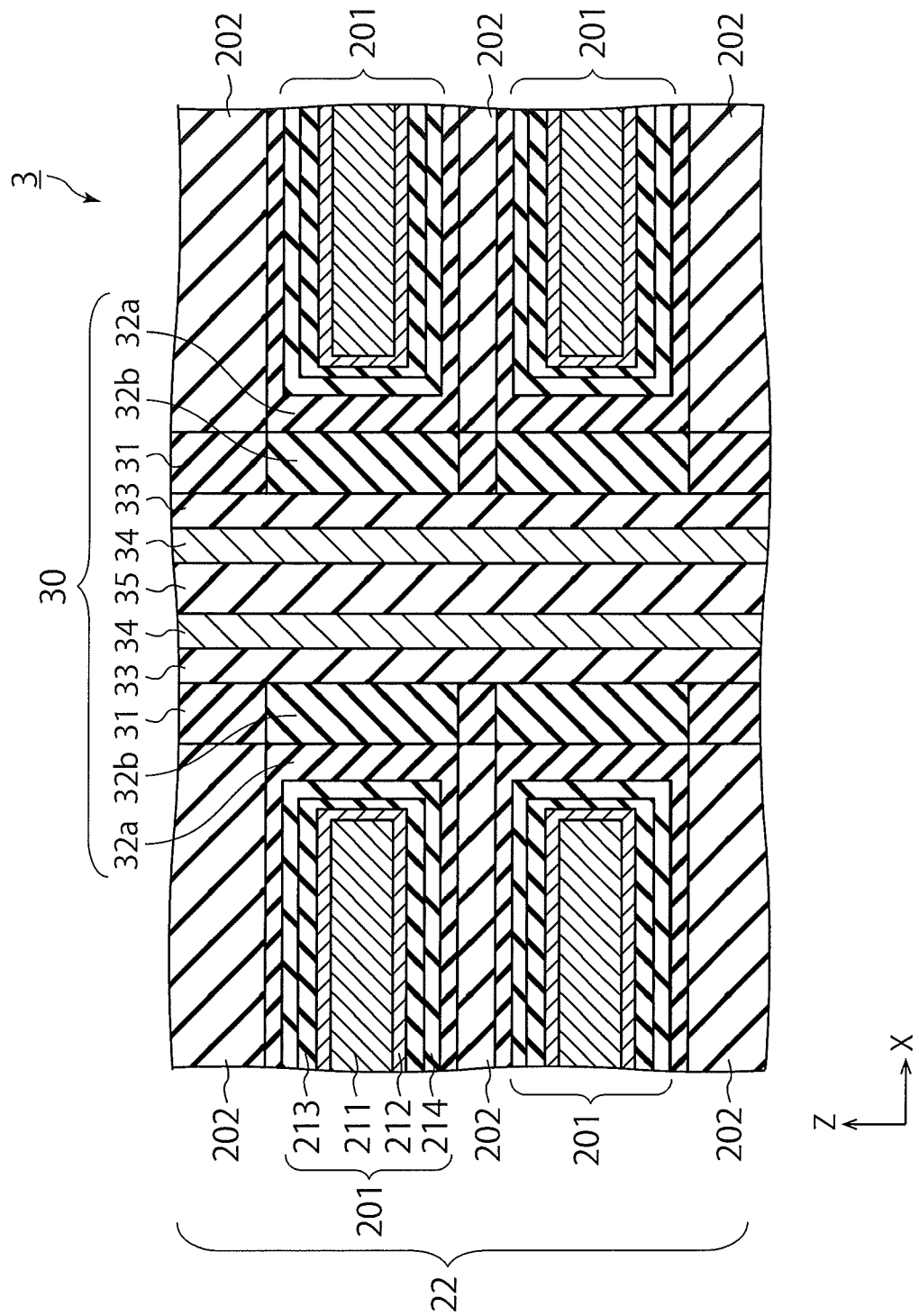
FIG. 15 is a cross sectional view of a cell of a semiconductor storage device relating to a third embodiment.

FIG. 15 is a cross sectional view of a cell of a semiconductor storage device relating to the third embodiment. The same signs are attached to the components similar to that of the first embodiment described above, and the detailed description is omitted.

In a semiconductor storage device 3 relating to the present embodiment, the charge storage films 32a cover the electrode films 201. That is, the charge storage films 32a are provided not only between the electrode films 201 and the charge storage films 32b but also between the electrode films 201 and the interlayer insulating films 202. In addition, similarly to the first embodiment, the width in the Z direction of the charge storage film 32a and the charge storage film 32b is greater than the width in the Z direction of the metal film 211.

Hereinafter, with reference to FIG. 16 and FIG. 17, the manufacturing process of the semiconductor storage device 3 relating to the present embodiment will be described. However, since the process from the formation of the laminated body 22a to the formation of the charge storage films 32b is similar to the first embodiment, the description is omitted.

Figure 16:
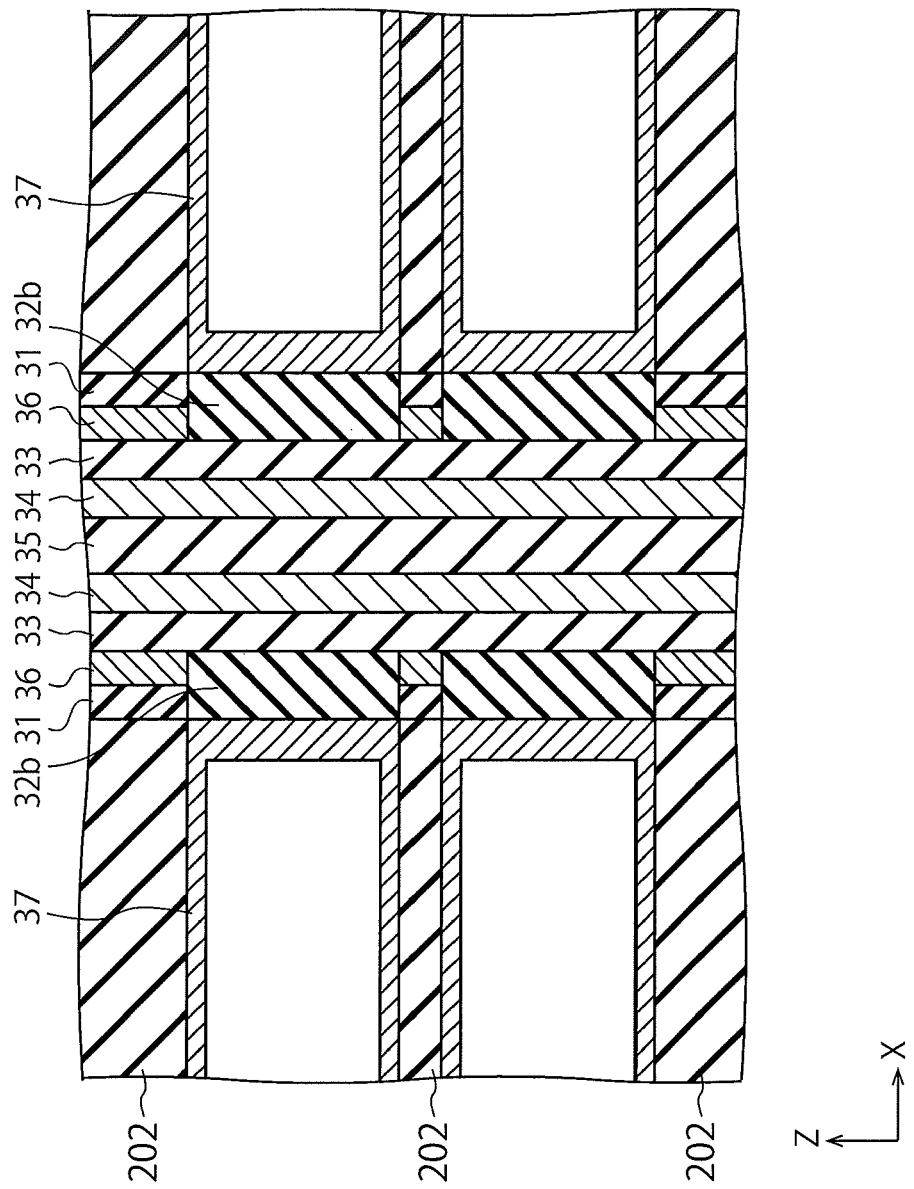
FIG. 16 is a cross sectional view illustrating a process of forming a charge storage film of the third embodiment.

In the present embodiment, after forming the charge storage films 32b, as illustrated in FIG. 16, the metal films 37 are formed by the CVD or the ALD for example. At the time, the metal films 37 are formed not only on the charge storage films 32b but also on the interlayer insulating films 202. That is, the metal films 37 are formed entirely on the surfaces exposed by removing the sacrifice films 201a.

Figure 17:
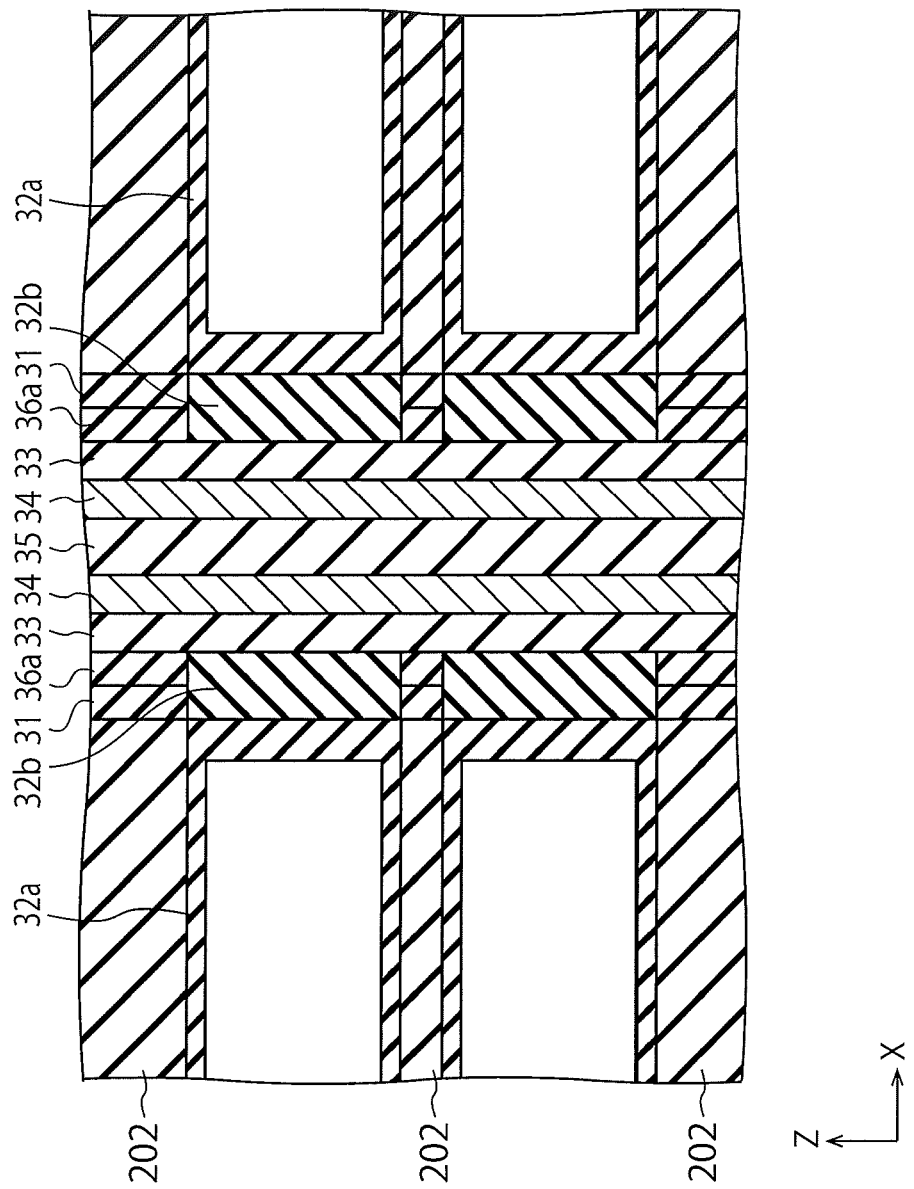
FIG. 17 is a cross sectional view illustrating the process of forming the charge storage film of the third embodiment.

Next, as illustrated in FIG. 17, by subjecting the metal films 37 to the radical oxidation similarly to the first embodiment, the charge storage films 32a are formed. In this way, the charge storage films 32a are formed both on the charge storage films 32b and on the interlayer insulating films 202. In addition, similarly to the first embodiment, when forming the charge storage films 32a, the polysilicon remaining in the dummy film 36 is oxidized and the silicon oxide films 36a are also formed.

Thereafter, similarly to the first embodiment, at the removed parts of the sacrifice films 201a, the block insulating film 214, the block insulating film 213, the barrier metal film 212 and the metal film 211 are formed in the order. As a result, the cell 22 illustrated in FIG. 15 is completed.

According to the present embodiment described above, since the charge storage films 32a are formed entirely at the removed parts of the sacrifice films 201a, the need of selectively forming the charge storage films 32a (the metal films 37) on the charge storage films 32b is eliminated. In addition, the charge storage films 32a provided on an upper surface and a lower surface of the electrode films 201 are divided from the other charge storage films 32a facing in the Z direction by the interlayer insulating films 202. Thus, the charge retention characteristic can be improved by an easy film formation process.

Fourth Embodiment

Figure 18:
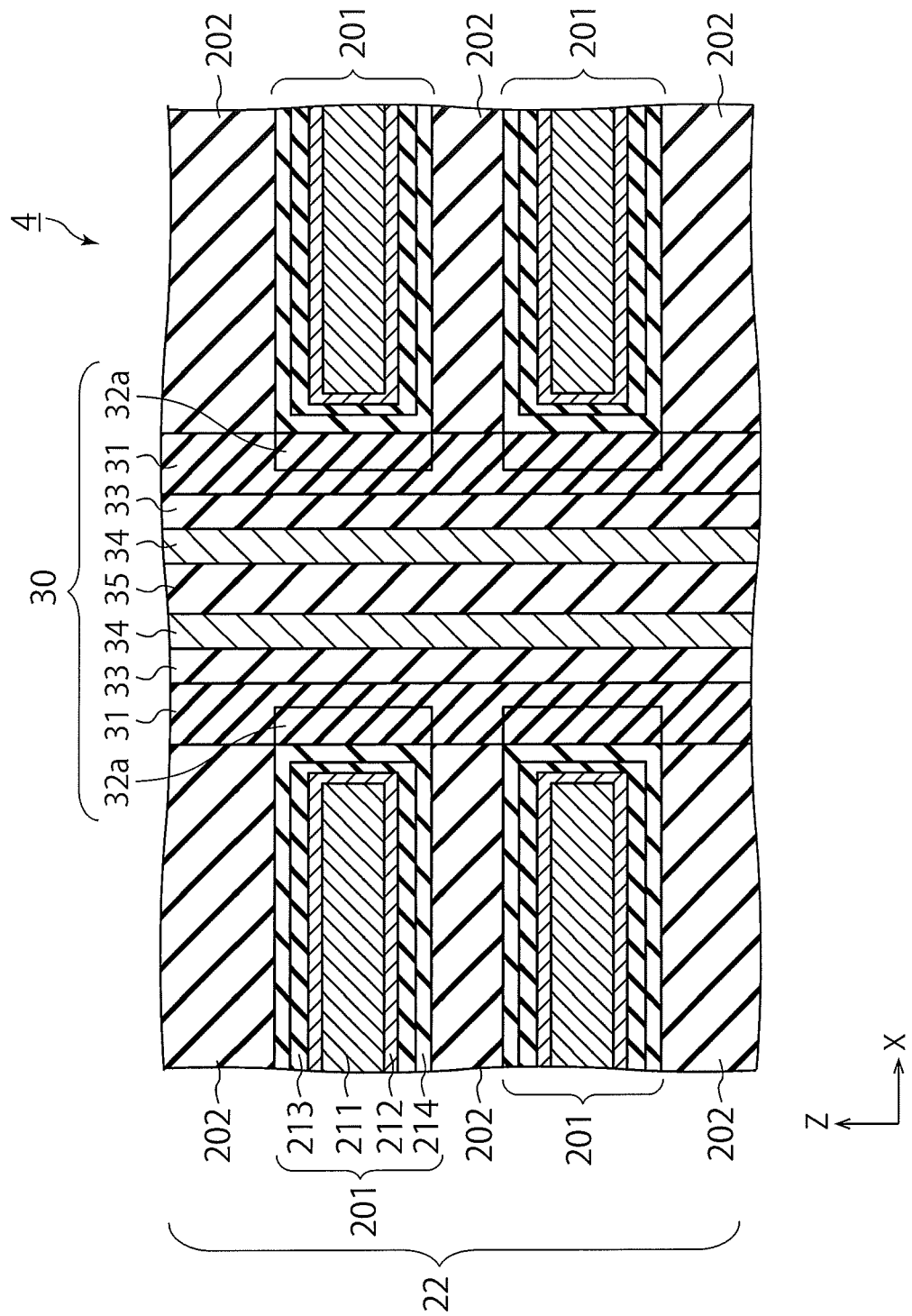
FIG. 18 is a cross sectional view of a cell of a semiconductor storage device relating to a fourth embodiment.

FIG. 18 is a cross sectional view of a cell of a semiconductor storage device relating to the fourth embodiment. The same signs are attached to the components similar to that of the first embodiment described above, and the detailed description is omitted.

In the first embodiment-the third embodiment described above, a film that retains the electric charges has a two-layer structure including the charge storage film 32a and the charge storage film 32b. On the other hand, in the semiconductor storage device 4 relating to the present embodiment, the film that retains the electric charges has a single-layer structure of only the charge storage film 32a.

In the present embodiment, while an outer surface of the charge storage film 32a is in contact with the electrode film 201, an inner surface of the charge storage film 32a is in contact with the block insulating film 31. That is, part of the block insulating film 31 is interposed between the charge storage film 32a and the tunnel insulating film 33. In addition, the width in the Z direction of the charge storage film 32a is greater than the width in the Z direction of the metal film 211.

Hereinafter, with reference to FIG. 19 and FIG. 20, the manufacturing process of the semiconductor storage device 4 relating to the present embodiment will be described. However, since the process from the formation of the laminated body 22a to removal of the sacrifice films 201a and the exposed part of the block insulating film 31 is similar to the first embodiment, the description is omitted.

Figure 19:
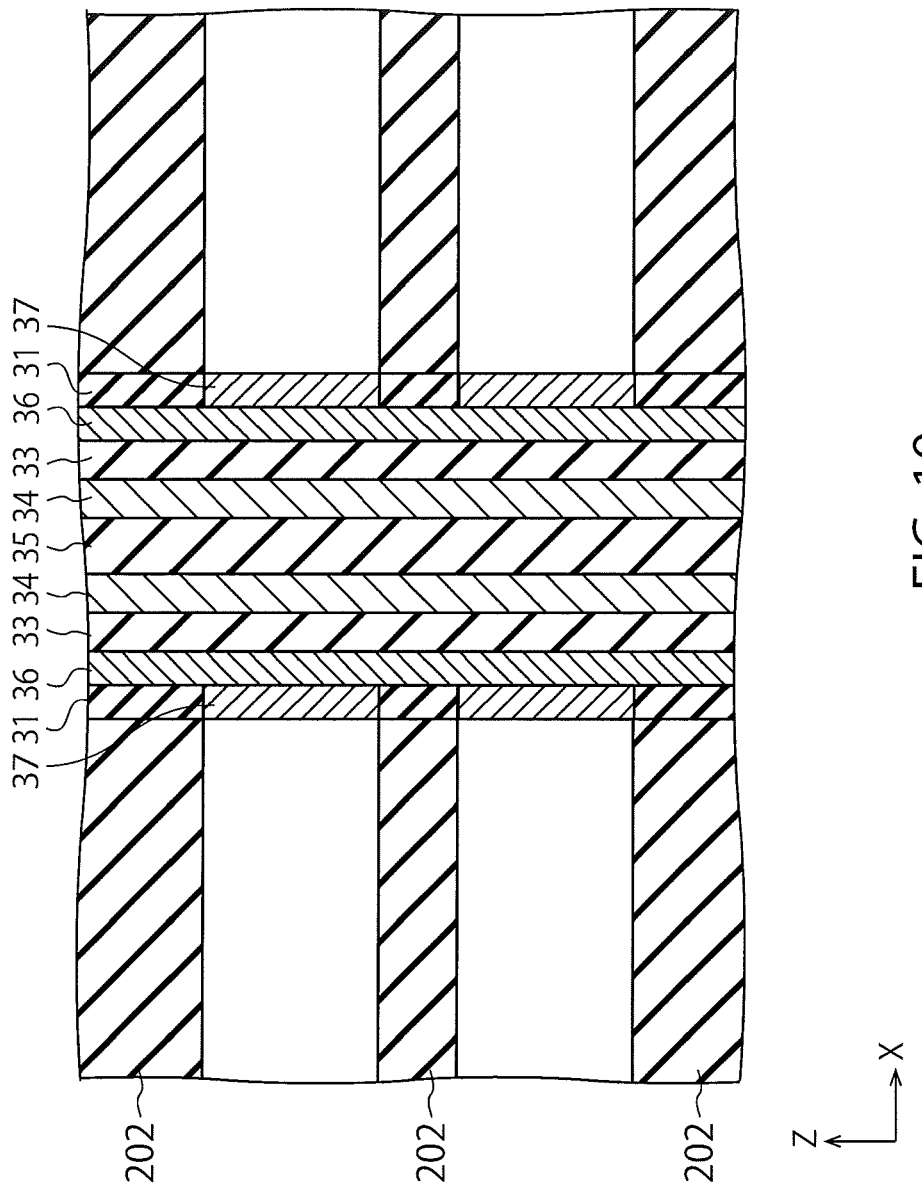
FIG. 19 is a cross sectional view illustrating a process of forming a charge storage film of the fourth embodiment.

In the present embodiment, as illustrated in FIG. 19, the metal films 37 are selectively formed at the removed part of the block insulating film 31, which is on the dummy film 36, by sputtering for example.

Figure 20:
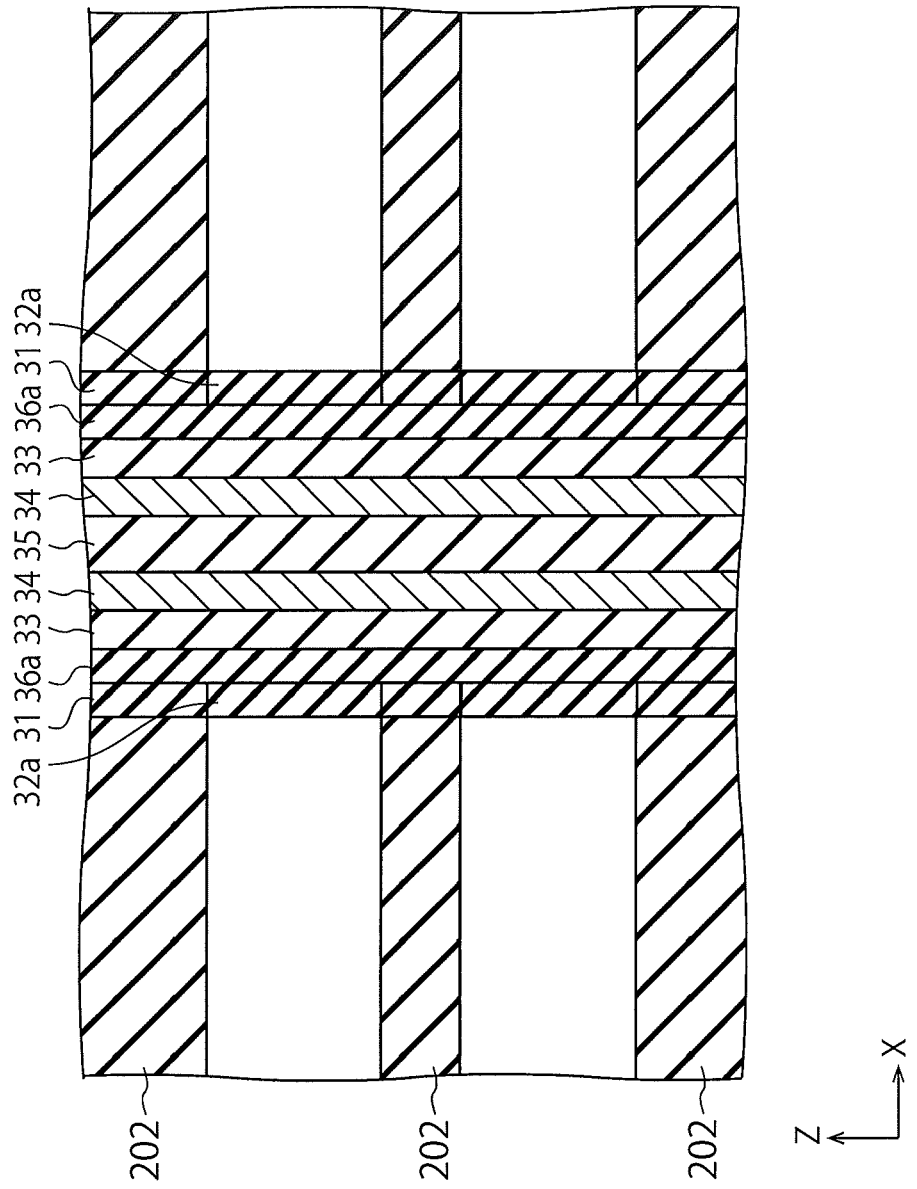
FIG. 20 is a cross sectional view illustrating the process of forming the charge storage film of the fourth embodiment.

Next, as illustrated in FIG. 20, by subjecting the metal films 37 to the radical oxidation similarly to the first embodiment, the charge storage films 32a are formed. At the time, the polysilicon contained in the dummy film 36 is also oxidized and the silicon oxide films 36a are formed. Part of the silicon oxide films 36a is interposed between the charge storage film 32a and the tunnel insulating film 33.

Thereafter, at the removed parts of the sacrifice films 201a, the block insulating film 214, the block insulating film 213, the barrier metal film 212 and the metal film 211 are formed in the order. Thus, the cell 22 illustrated in FIG. 18 is completed. In the cell 22, the block insulating film 31 is provided between the charge storage films 32a facing each other in the Z direction. Therefore, the movement in the first direction of the electric charges retained in the charge storage films 32a can be limited.

In addition, according to the present embodiment, since the charge storage films 32a have a monolayer structure, film formation time of the charge storage films can be shortened compared to the two-layer structure.

Fifth Embodiment

Figure 21:
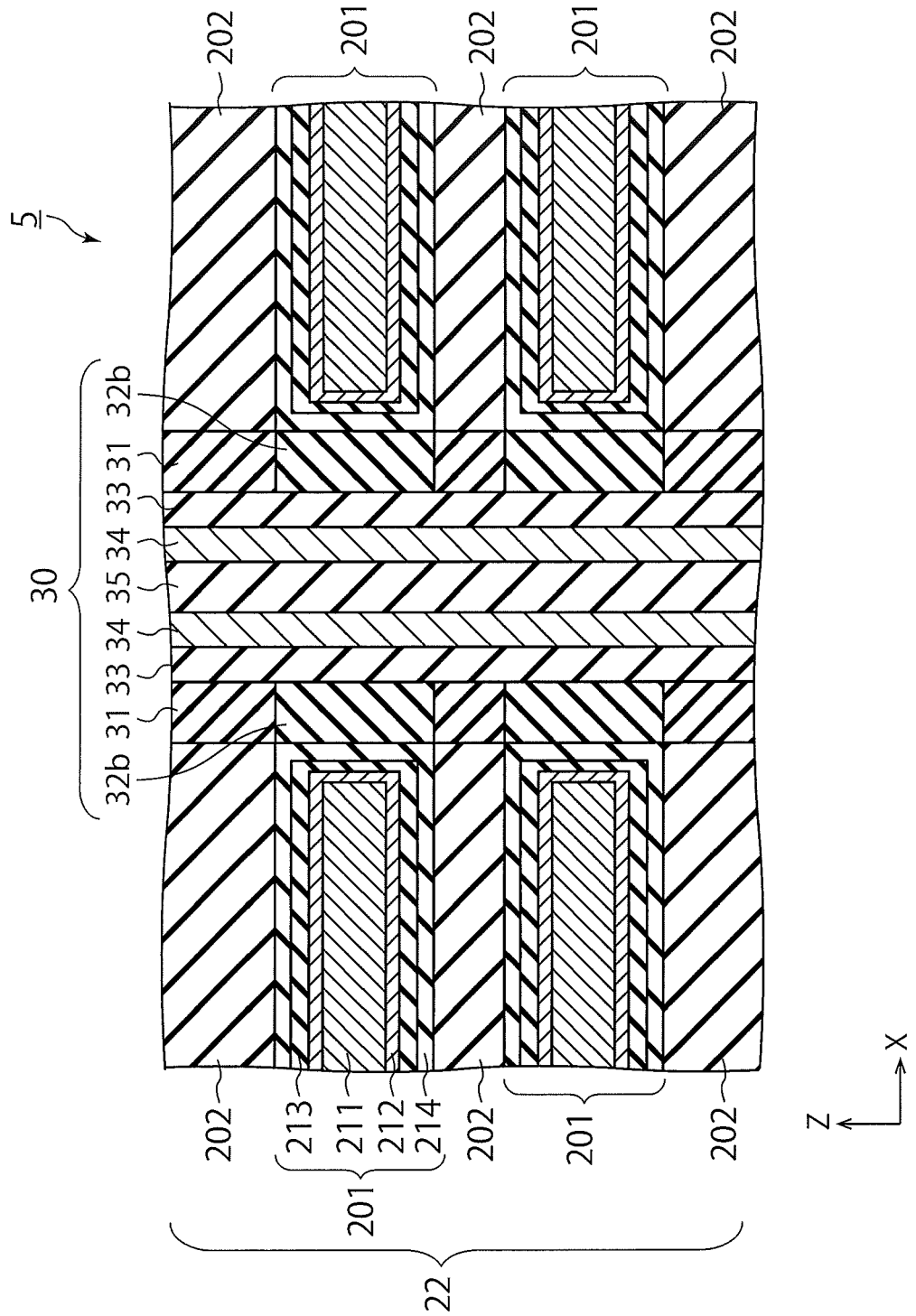
FIG. 21 is a cross sectional view of a cell of a semiconductor storage device relating to a fifth embodiment.

FIG. 21 is a cross sectional view of a cell of a semiconductor storage device relating to the fifth embodiment. The same signs are attached to the components similar to that of the first embodiment described above, and the detailed description is omitted.

While the film that retains the electric charges is only the charge storage film 32a in the fourth embodiment described above, the film that retains the electric charges is only the charge storage film 32b in a semiconductor storage device 5 relating to the present embodiment.

In the present embodiment, the charge storage film 32b is provided between the block insulating film 214 and the tunnel insulating film 33. In addition, between the charge storage films 32b facing each other in the Z direction, the block insulating film 31 is provided. Further, the width in the Z direction of the charge storage film 32b is greater than the width in the Z direction of the metal film 211.

Figure 22:
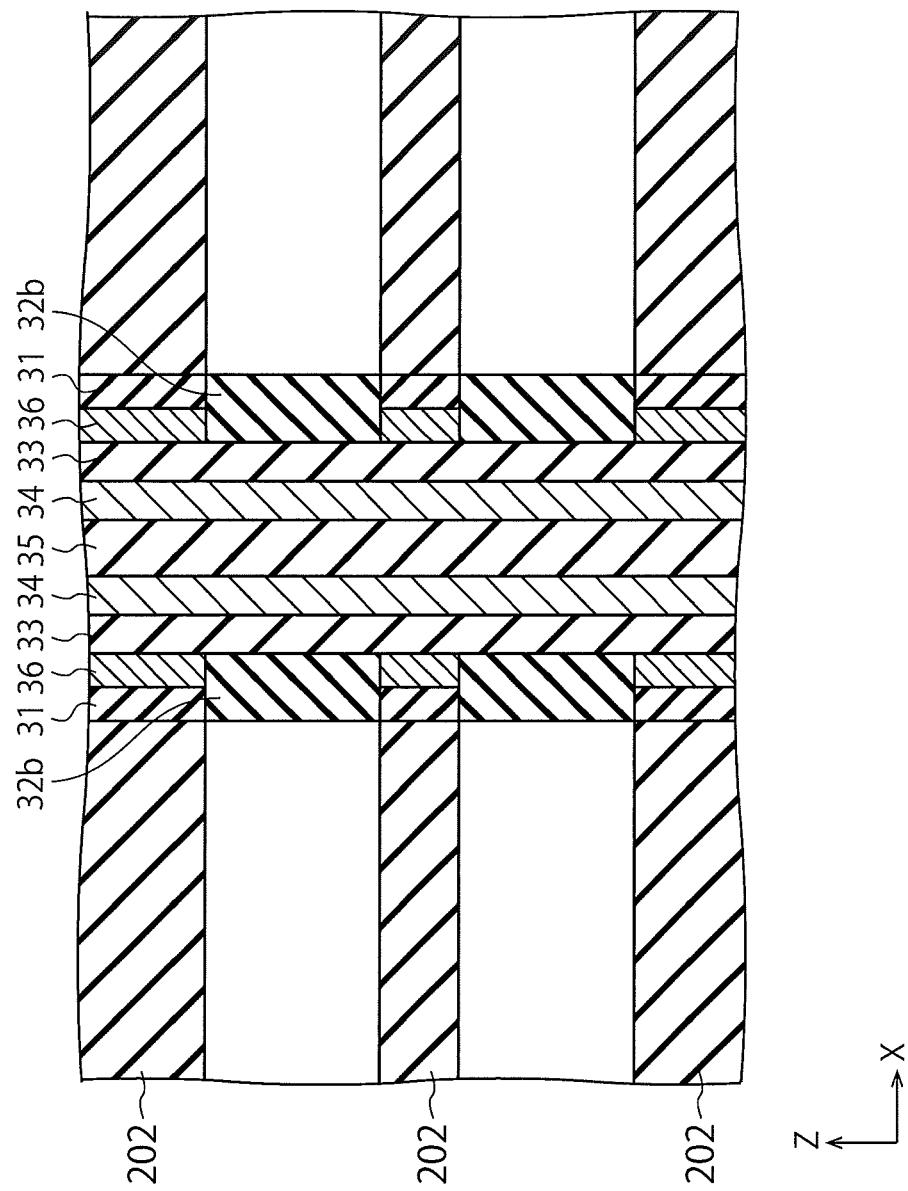
FIG. 22 is a cross sectional view illustrating a process of forming a charge storage film of the fifth embodiment.
Figure 23:
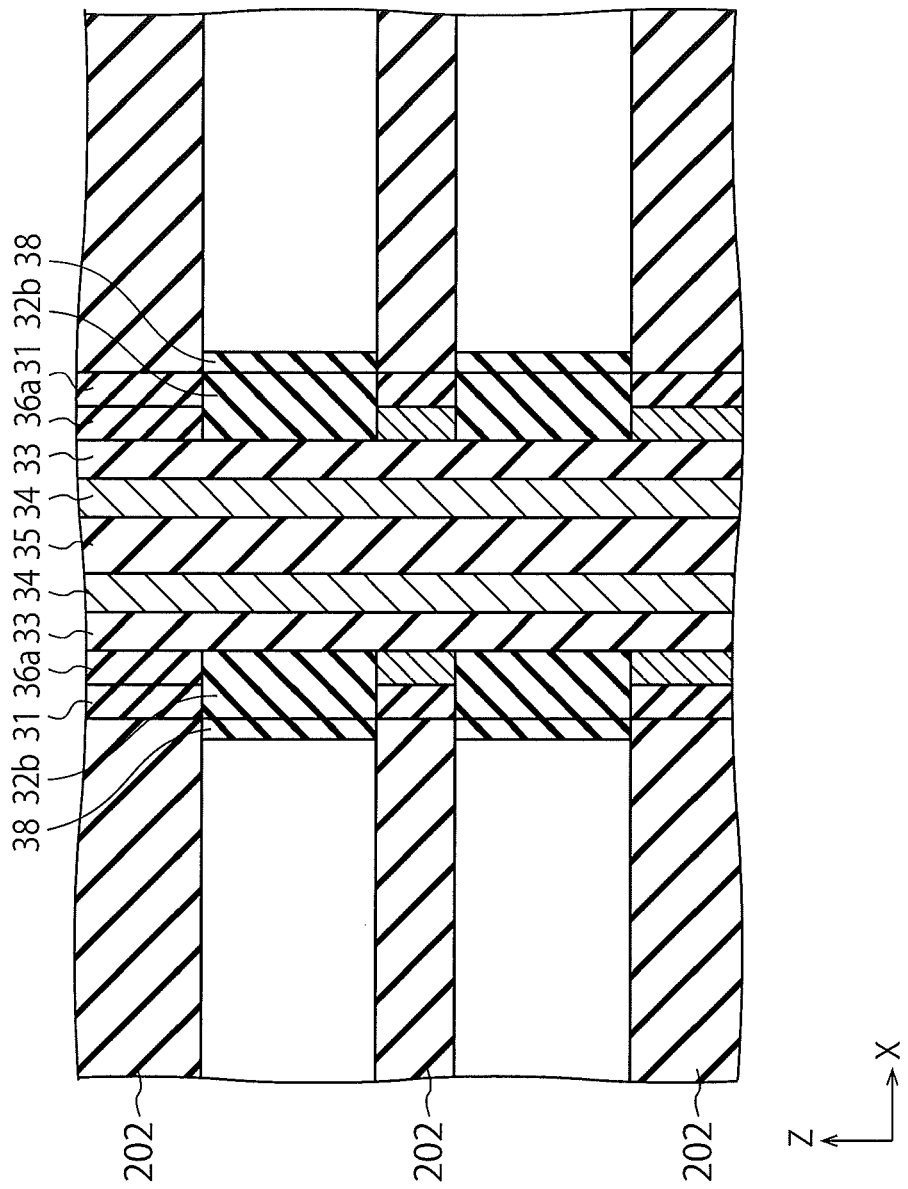
FIG. 23 is a cross sectional view illustrating the process of forming the charge storage film of the fifth embodiment.

Hereinafter, with reference to FIG. 22 and FIG. 23, the manufacturing process of the semiconductor storage device 5 relating to the present embodiment will be described. However, since the process from the formation of the laminated body 22a to the formation of the charge storage films 32b is similar to the first embodiment, the description is omitted. Note that, the charge storage films 32b can be formed by increasing the silicon nitride film in which the polysilicon contained in the dummy film 36 is subjected to the radical nitriding or thermal nitriding, by the thickness of the block insulating film 31.

Note that, to the charge storage films 32b, impurities may be introduced. The impurities include, for example, one element or two or more elements of hafnium, aluminum, titanium, barium, ruthenium, lanthanum, zirconium, iodine, magnesium, tungsten, strontium, niobium, oxygen, carbon, boron, and fluorine. For example, when a gas containing the impurities described above is introduced at the time of nitriding the polysilicon or at the time of increasing the silicon nitride film, the impurities can be contained in the charge storage films 32b.

Next, the surface of the charge storage film 32b is subjected to the radical oxidation. As a result, as illustrated in FIG. 23, the oxide films 38 are formed on the charge storage films 32b. The oxide films 38 correspond to part of the block insulating film 214. In addition, when forming the oxide films 38, the polysilicon of the dummy film 36 not nitrided when forming the charge storage films 32b is oxidized and the silicon oxide films 36a are also formed. The silicon oxide films 36a are integrated with the block insulating film 31 containing the silicon oxide.

Thereafter, at the removed parts of the sacrifice films 201a, the block insulating film 214, the block insulating film 213, the barrier metal film 212 and the metal film 211 are formed in the order. Thus, the cell 22 illustrated in FIG. 21 is completed. In the cell 22, the charge storage films 32b facing each other in the Z direction are separated by the block insulating film 31. Therefore, the movement in the first direction of the electric charges retained in the charge storage films 32b can be limited.

In addition, according to the present embodiment, since the charge storage film 32b has the monolayer structure, the film formation time of the charge storage film can be shortened compared to the two-layer structure.

(Modification 2)

Figure 24:
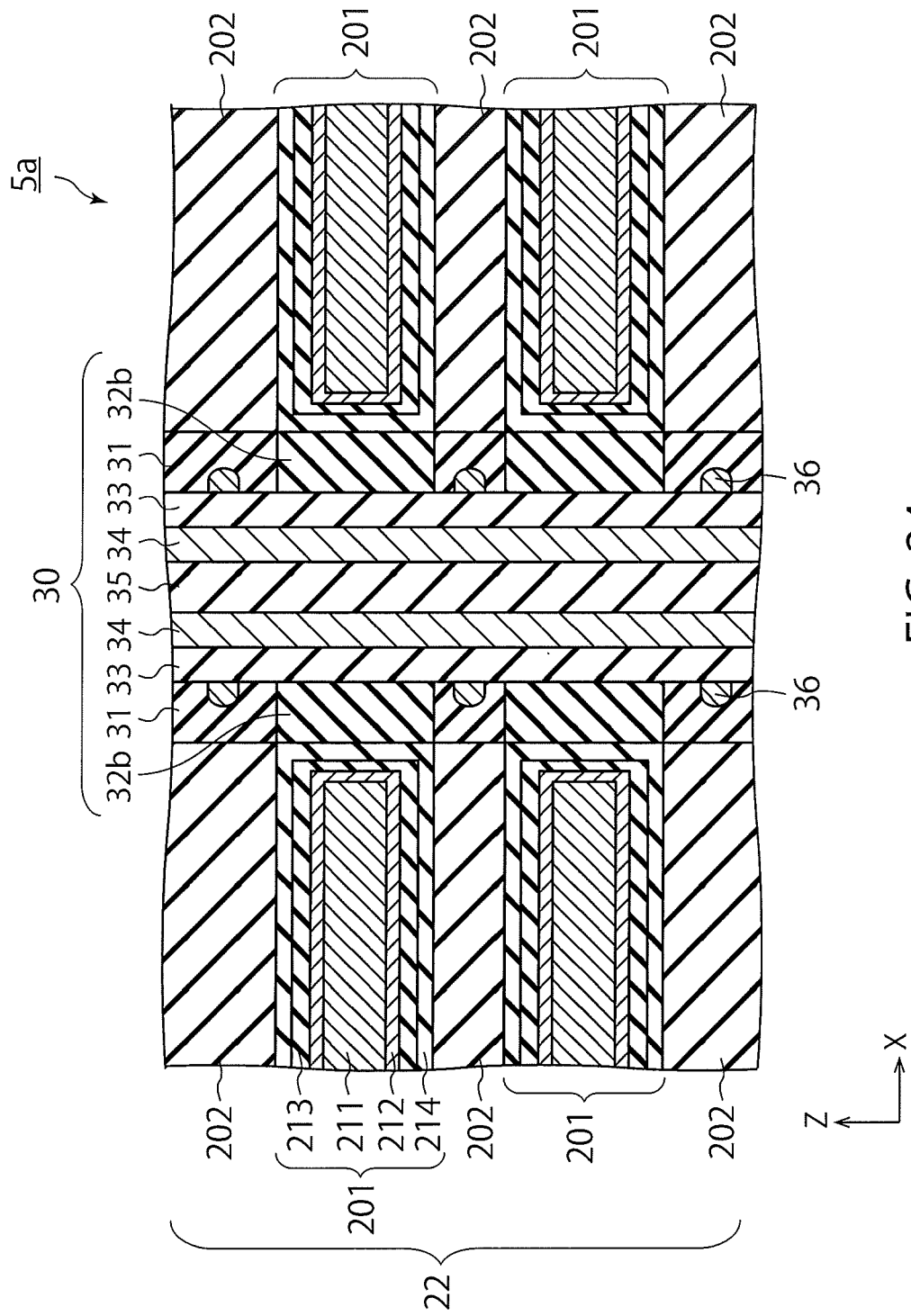
FIG. 24 is a cross sectional view of a cell of a semiconductor storage device relating to a modification of the fifth embodiment.

FIG. 24 is a cross sectional view of a cell of a semiconductor storage device relating to the modification of the fifth embodiment. The same signs are attached to the components similar to that of the fifth embodiment described above, and the detailed description is omitted.

In a semiconductor storage device 5a illustrated in FIG. 24, part of the dummy film 36 remains inside the block insulating film 31. The part is the polysilicon film remaining without being oxidized when forming the oxide films 38 (see FIG. 23).

In the present modification, the dummy film 36 remaining without being oxidized is covered with the block insulating film 31 as illustrated in FIG. 24, thereby being away from the charge storage films 32b. Therefore, the charge storage films 32b facing each other in the Z direction are not connected through the dummy film 36 so that the movement in the Z direction of the electric charges retained in the charge storage films 32b can be limited.

Thus, the charge retention characteristic can be improved also in the present modification. In addition, in the present modification, since there is no need to completely oxidize the dummy film 36, the oxidation time of the dummy film 36 can be shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a stacked body in which electrode films and insulating films are alternately stacked in a first direction, wherein the electrode films includes a first electrode film and a second electrode film;
a semiconductor film extending in the first direction inside the stacked body;
a first charge storage member provided between the semiconductor film and the first electrode film in a second direction intersecting the first direction;
a second charge storage member provided between the semiconductor film and the second electrode film in the second direction and separated from the first charge storage member in the first direction; and
a tunnel insulating film that extends in the first direction inside the stacked body and is in contact with the first and the second charge storage members, wherein the electrode film includes a metal film, and a first block insulating film that is provided between the metal film and the first and second charge storage members, and the first charge storage member includes:
a first charge storage film that is in contact with the first electrode film and contains a High-k material;
a first oxide film that is in contact with the first charge storage film: and
a second charge storage film that is provided between the first oxide film and the tunnel insulating film and contains silicon nitride, wherein the second charge storage film is in contact with the tunnel insulating film, and the second charge storage member includes:
a third charge storage film that is in contact with the second electrode film and contains a High-k material;
a second oxide film that is in contact with the third charge storage film; and
a fourth charge storage film that is provided between the second oxide film and the tunnel insulating film and contains silicon nitride, wherein the fourth charge storage film is in contact with the tunnel insulating film, and
a second block insulating film is provided between the second charge storage film and the fourth charge storage film in the first direction and is in contact with the second charge storage film and the fourth charge storage film, wherein the second block insulating film is in contact with the tunnel insulating film.

2. The semiconductor storage device according to claim 1, wherein the High-k material is oxide or oxynitride containing at least one of hafnium (Hf), aluminum (Al), titanium (Ti), barium (Ba), ruthenium (Ru), lanthanum (La), zirconium (Zr), iodine (Y), magnesium (Mg), tantalum (Ta), strontium (Sr), and niobium (Nb).

3. The semiconductor storage device according to claim 2, wherein the High-k material is hafnium oxide ($HfO_2$), zirconium oxide ($ZrO_2$), iodine oxide ($Y_2O_3$), tantalum oxide ($Ta_2O_5$), or strontium titanate ($SrTiO_3$).

4. The semiconductor storage device according to claim 1, further comprising an oxide film that is contact with the first film and the second film.

5. The semiconductor storage device according to claim 1, wherein
the width of the second film in a second direction orthogonal to the first direction is greater than that of the first film.

6. The semiconductor storage device according to claim 1, wherein
the first and second oxide films contain silicon (Si) and oxygen (O).

7. The semiconductor storage device according to claim 1, wherein the High-k material contains hafnium (Hf) or zirconium (Zr).

* * * * *